(12) United States Patent
Tsou et al.

(10) Patent No.: US 11,456,245 B2
(45) Date of Patent: Sep. 27, 2022

(54) SILICON INTERPOSER INCLUDING THROUGH-SILICON VIA STRUCTURES WITH ENHANCED OVERLAY TOLERANCE AND METHODS OF FORMING THE SAME

(71) Applicant: Taiwan Semiconductor Manufacturing Company Limited, Hsinchu (TW)

(72) Inventors: Hsien-Ju Tsou, Taipei (TW); Chih-Wei Wu, Zhuangwei Township (TW); Ying-Ching Shih, Hsinchu (TW); Szu-Wei Lu, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 74 days.

(21) Appl. No.: 17/032,265

(22) Filed: Sep. 25, 2020

(65) Prior Publication Data

US 2021/0375741 A1  Dec. 2, 2021

Related U.S. Application Data

(63) Continuation-in-part of application No. 16/885,384, filed on May 28, 2020, now Pat. No. 11,296,032.

(51) Int. Cl.
*H01L 21/50* (2006.01)
*H01L 23/498* (2006.01)
*H01L 23/538* (2006.01)
*H01L 21/48* (2006.01)
*H01L 23/00* (2006.01)

(52) U.S. Cl.
CPC ...... *H01L 23/49872* (2013.01); *H01L 21/486* (2013.01); *H01L 23/49816* (2013.01); *H01L 23/49827* (2013.01); *H01L 23/5384* (2013.01); *H01L 24/16* (2013.01); *H01L 24/81* (2013.01); *H01L 2924/15172* (2013.01)

(58) Field of Classification Search
CPC ............. H01L 21/486; H01L 23/49816; H01L 23/49827; H01L 23/49872; H01L 23/5384; H01L 24/16; H01L 24/81; H01L 2924/15172
USPC ......................................................... 438/125
See application file for complete search history.

(56) References Cited

U.S. PATENT DOCUMENTS

2018/0102311 A1\*  4/2018  Shih .................. H01L 23/49827

\* cited by examiner

*Primary Examiner* — Luan C Thai
(74) *Attorney, Agent, or Firm* — The Marbury Law Group, PLLC

(57) ABSTRACT

An array of through-silicon via (TSV) structures is formed through a silicon substrate, and package-side metal pads are formed on backside surfaces of the array of TSV structures. The silicon substrate is disposed over a carrier substrate, and an epoxy molding compound (EMC) interposer frame is formed around the silicon substrate. A die-side redistribution structure is formed over the silicon substrate and the EMC interposer frame, and at least one semiconductor die is attached to the die-side redistribution structure. The carrier substrate is removed from underneath the package-side metal pads. A package-side redistribution structure is formed on the package-side metal pads and on the EMC interposer frame. Overlay tolerance between the package-side redistribution wiring interconnects and the package-side metal pads increases due to increased areas of the package-side metal pads.

20 Claims, 30 Drawing Sheets

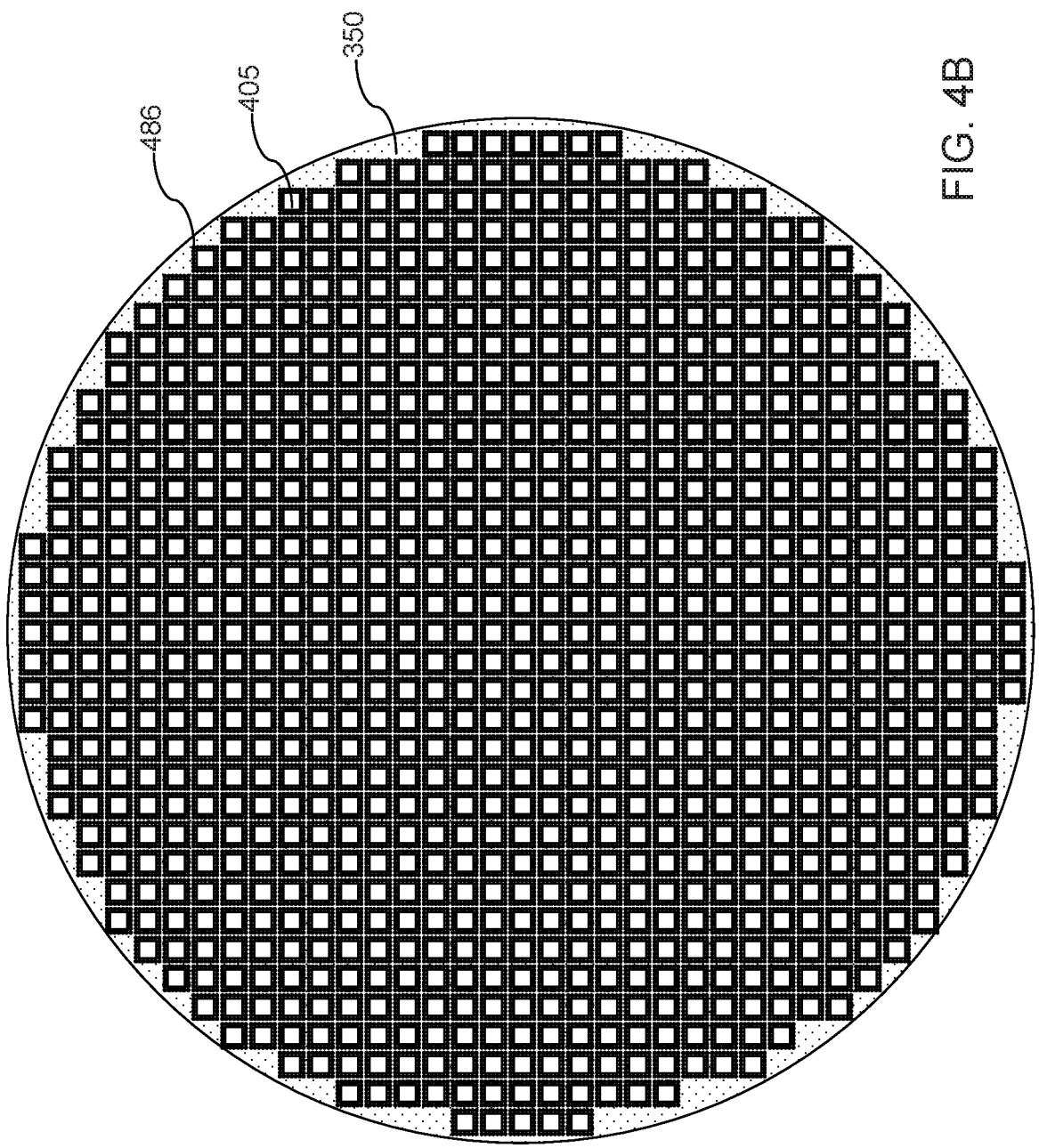

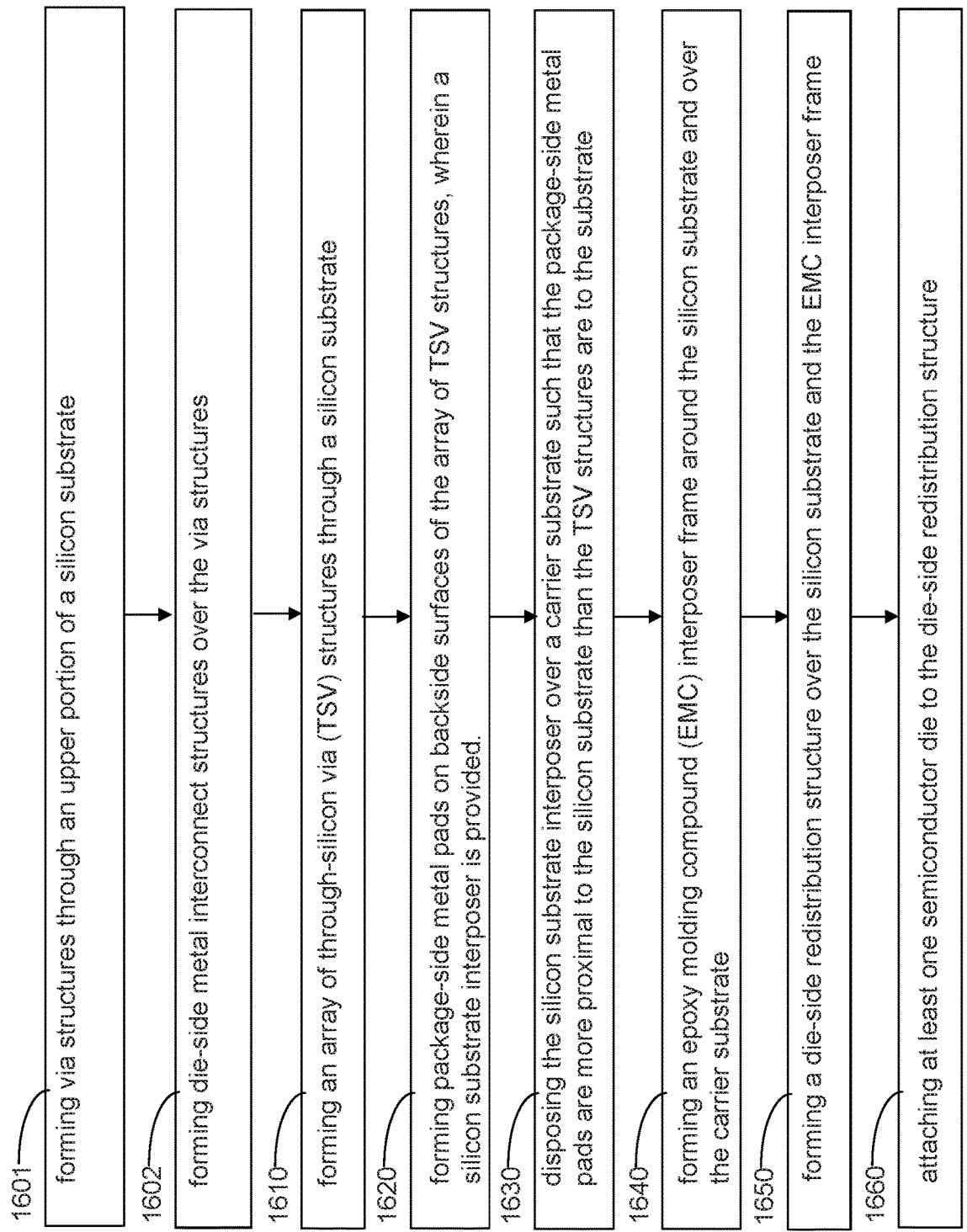

SILICON INTERPOSER INCLUDING THROUGH-SILICON VIA STRUCTURES WITH ENHANCED OVERLAY TOLERANCE AND METHODS OF FORMING THE SAME

RELATED APPLICATION

The instant application is a continuation-in-part (CIP) application of U.S. application Ser. No. 16/885,384 filed on May 28, 2020, the entire contents of which are incorporated herein by reference.

BACKGROUND

During manufacturing of a fan-out wafer level package (FOWLP), a pick and place operation is used to position a die or an interposer prior to formation of an epoxy molding compound (EMC) frame and redistribution layers. The pick and place operation is a mechanical operation that may introduce lateral variations during placement the die or an interposer on the order of, or greater than, 5 microns. As the pitch of through-substrate via structures approach dimensions on the order of 10 microns, placement errors during the pick and place operations may cause defective electrical connection between through-substrate via structures and redistribution layers, and thus, incur yield losses during packing of a semiconductor die.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4B is a top-down view of the exemplary structure of FIG. 3A.

FIG. 17 is a second flowchart illustrating steps for forming a chip package structure according to an embodiment of the present disclosure.

DETAILED DESCRIPTION

Figure 1A:
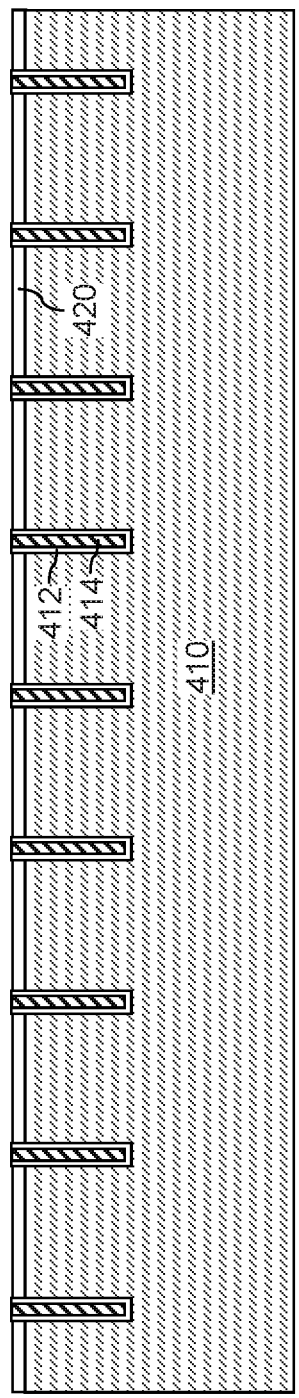
FIGS. 1A-1H are sequential vertical cross-sectional views of a structure for forming a bridge die according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and particularly to a chip package structure containing a silicon interposer including through-substrate via structures with enhanced overlay tolerance and method of forming the same.

Generally, the methods and structures of the present disclosure may be used to provide a fan-out silicon interposer that is less prone to overlay variations during placement of a bridge die on a carrier wafer during assembly. The bridge die includes an array of through-silicon via (TSV) structures and package-side metal pads contacting package-side end surfaces of the array of TSV structures. The package-side metal pads provide a greater area than the end surfaces of the TSV structures such that alignment of a package-side redistribution structure to the package-side metal pads is less prone to inadvertent electrical opens (electrical disconnects) or inadvertent electrical shorts (electrical connections) despite large overlay variations that may occur during placement of the bridge die to a wafer carrier for forming a reconstituted wafer. An encapsulant interposer frame, such as an epoxy molding compound (EMC) interposer frame laterally surrounds each bridge die in the reconstituted wafer, which may be processed to form die-side redistribution structures on one side. At least one semiconductor die may be attached to each reconstituted die, and the carrier wafer may be subsequently detached. A package-side redistribution structure may be formed on the reconstituted wafer directly on the package-side metal pads, which may provide enhanced tolerance to overlay variations between package-side redistribution wiring interconnects and the array of the TSV structures due to the intervening package-side metal pads. A fan-out silicon interposer may be formed on each set of at least one semiconductor die. The reconstituted wafer may be diced to singulate each combination of a fan-out silicon interposer and an attached set of at least one semiconductor die. Process yield and reliability of the fan-out silicon interposer may be increased through use of the package-side metal pads. The various aspects of the methods and structures of embodiments of the present disclosure are now described with reference to the accompanying drawings.

Referring to FIG. 1A. a structure for forming a bridge die is illustrated according to an embodiment of the present disclosure. The bridge die is an interposer structure that includes a silicon substrate 410 and a front-side insulating layer 420 formed on a front-side surface of the silicon substrate 410. The front-side insulating layer 420 includes an insulating material such as silicon oxide, and can be formed by deposition of the dielectric material or by thermal oxidation of a surface portion of the silicon substrate 410. The thickness of the silicon substrate 410 can be in a range from 20 nm to 400 nm, although lesser and greater thicknesses can also be employed. Electrically conductive structures vertically extending into the silicon substrate 410 can be formed. Such electrically conductive structures include through-substrate via structures 414 that are laterally surrounded by a respective through-substrate insulating spacer 412. The through-substrate via structures 414 may be initially formed as via structures within the silicon substrate 410 with a vertical dimension less than the thickness of the silicon substrate 410. Subsequently, the backside of the silicon substrate 410 may be removed such that the thickness of the silicon substrate 410 after thinning is less than the thickness of the through-substrate via structures 414, thereby providing the "through-substrate" configuration for the through-substrate via structure 414.

The silicon substrate 410 as initially provided may be a commercially available silicon wafer having a diameter of 150 mm, 200 mm, 300 mm, or 450 mm, and having a thickness in a range from 675 microns to 825 microns. The silicon substrate 410 may include electrical dopants (such as p-type dopants or n-type dopants) at an atomic concentration less than $1.0 \times 10^{14}/cm^3$ in order to provide low electrical conductivity and to minimize eddy current that may be induced by inductive coupling with high frequency electrical signals from, to, or between semiconductor dies or redistribution wiring interconnects to be subsequently placed in proximity.

The silicon substrate 410 may include a two-dimensional array (such as a rectangular array) of die areas. Each die area may correspond to the area of a bridge die that may be subsequently formed. An array of deep trenches having a depth greater than 20 microns may be formed within each die area of the silicon substrate 410. For example, a hard mask layer (such as a silicon nitride layer and/or a borosilicate glass layer) may be formed on over the front-side insulating layer 420, and a photoresist layer may be applied over the hard mask layer. The photoresist layer may be lithographically patterned to form an array of openings therethrough, and the pattern of the openings may be transferred into the hard mask layer. An anisotropic etch that uses the hard mask (and optionally the patterned photoresist layer) as an etch mask may be performed to form the deep trenches that vertically extend through the front-side insulating layer 420 and from the front-side surface of the silicon substrate 410 toward the backside of the silicon substrate 410. The photoresist layer may be consumed during the anisotropic etch process, and the hard mask layer may be subsequently removed, for example, using a wet etch process. An array of openings, which are herein referred to as deep trenches, vertically extend through the front-side insulating layer 420 and from the front-side surface of the silicon substrate 410 toward the backside surface of the silicon substrate 410.

The depth of the deep trenches may be in a range from 10 microns to 100 microns, such as from 20 microns to 60 microns, although lesser and greater depths may also be used. The maximum lateral dimension of each deep trench (such as a diameter) may be in a range from 3 microns to 30 microns, such as from 6 microns to 15 microns, although lesser and greater maximum lateral dimensions may also be used. Generally, the maximum lateral dimension for the deep trenches is selected to be large enough to provide deep etching into the silicon substrate 410, and is selected to be small enough to provide filling of the deep trenches with a combination of a through-substrate insulating spacer 412 and a through-substrate via (TSV) structure 414. The deep trenches may be formed in rows (i.e., one-dimensional arrays) with a one-dimensional periodicity, or may be formed as a two-dimensional array, which may be a periodic two-dimensional array (such as a rectangular array or a hexagonal array). The center-to-center distance between neighboring pairs of deep trenches may be in a range from 6 microns to 60 microns.

Figure 1B:
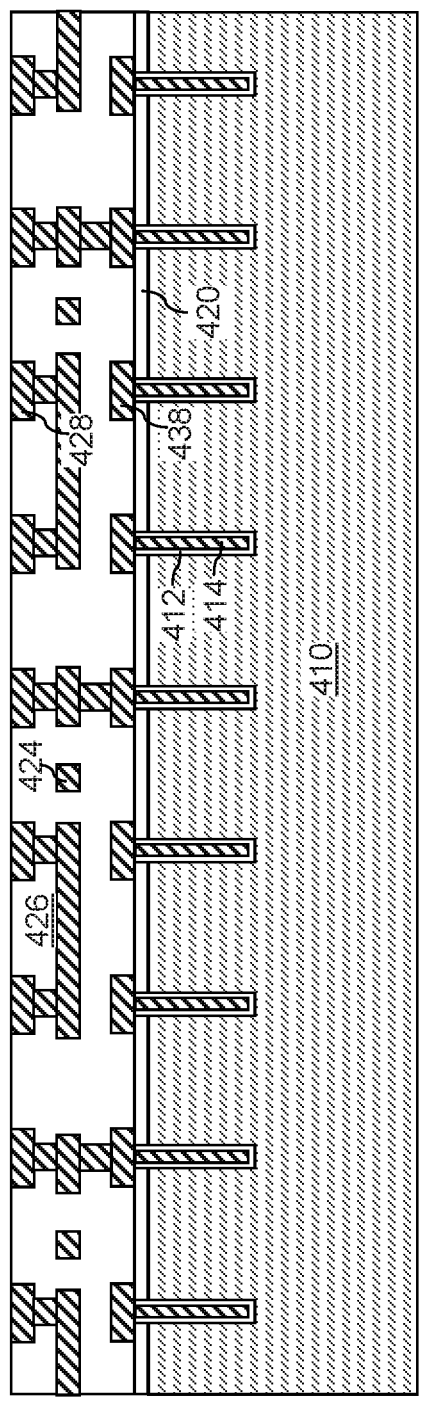

Referring to FIG. 1B, die-side dielectric material layers 426 may be deposited over the front-side insulating layer 420 and the array of TSV structures 414. Each of the die-side dielectric material layers 426 can include a dielectric material such as silicon oxide, porous or non-porous organosilicate glass, silicon carbon nitride, silicon nitride, or any other interconnect-level dielectric material known in the art. The total thickness of the die-side dielectric material layers 426 may be in a range from 200 nm to 10,000 nm, such as from 400 nm to 5,000 nm, although lesser and greater thicknesses may also be used.

Die-side metal interconnect structures 424 can be formed within the die-side dielectric material layers 426, for example, by forming line cavities, via cavities, and/or integrated line and via cavities at each level of the die-side dielectric material layers, by depositing at least one conductive material in the various cavities at each level, and by planarizing the at least one conductive material at each level. The die-side metal interconnect structures 424 can include metal line structures, metal via structures, metal pad structures, and/or integrated metal line and via structures. Back-end-of-line (BEOL) processing steps such as deep ultraviolet (DUV) lithography and dual damascene metal deposition and planarization processes can be performed to form the die-side metal interconnect structures 424 in the die-side dielectric material layers 426. The line width of the die-side dielectric material layers 426 can be in a range from 50 nm to 500 nm, such as from 100 nm to 250 nm, although lesser and greater widths can also be employed. The spacing between minimum-pitch lines can be in a range from 50 nm to 500 nm, such as from 100 nm to 250 nm, although lesser and greater widths can also be employed. Die-side metal pads 428 can be formed at the topmost level of the die-side dielectric material layers 426. In one embodiment, the die-side metal pads 428 may include copper pads or copper pillars that may be employed as microbumps. In one embodiment, the die-side metal pads 428 may have a maximum lateral dimension (such as a diameter) in a range from 10 microns to 50 microns, and may have a height in a range from 5 microns to 50 microns.

Figure 1C:
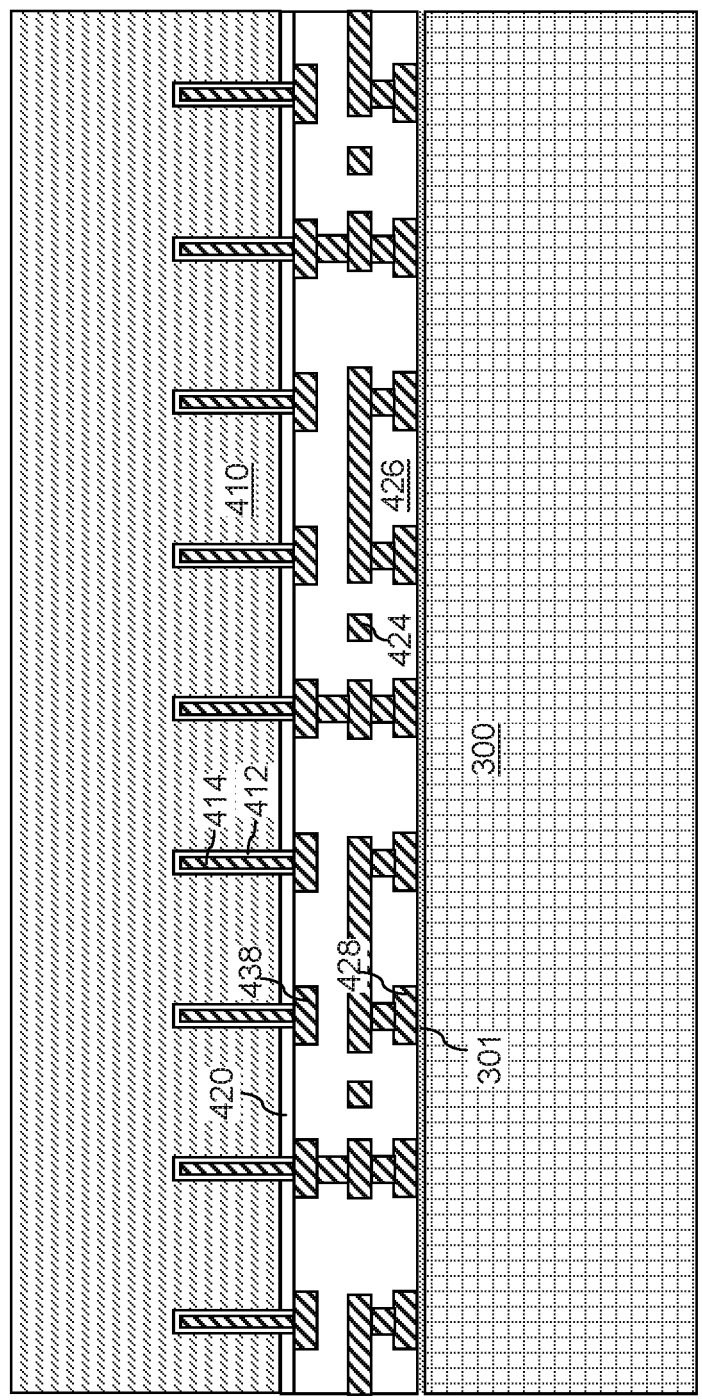

Referring to FIG. 1C, a carrier substrate 300 may be attached to the front-side surface of the structure of FIG. 1B that includes surfaces of the die-side metal pads 428. An adhesive layer 301 may be used to attach the carrier substrate 300 to the surfaces of the die-side metal pads 428. The carrier substrate 300 may have a same size as the silicon substrate 410.

In one embodiment, the carrier substrate 300 may include an optically transparent material such as glass or sapphire. In such embodiments, the adhesive layer 301 may include a light-to-heat conversion (LTHC) layer that may be deposited on the planar surface including the top surfaces of the die-side metal pads 428 and the die-side dielectric material layer 426. The LTHC layer is a solvent-based coating applied using a spin coating method, and forms a layer that converts ultraviolet light to heat to cause the material to lose adhesion. For example, the LTHC layer may include Light-To-Heat Conversion Release Coating (LTHC) Ink™ that is commercially available from The 3M Company®. Alternatively, the adhesive layer 301 may include a thermally decomposing adhesive material. For example, the adhesive layer 301 may include an acrylic pressure-sensitive adhesive that decomposes at an elevated temperature. The debonding temperature of the thermally decomposing adhesive material may be in a range from 150 degrees to 200 degrees.

Figure 1D:
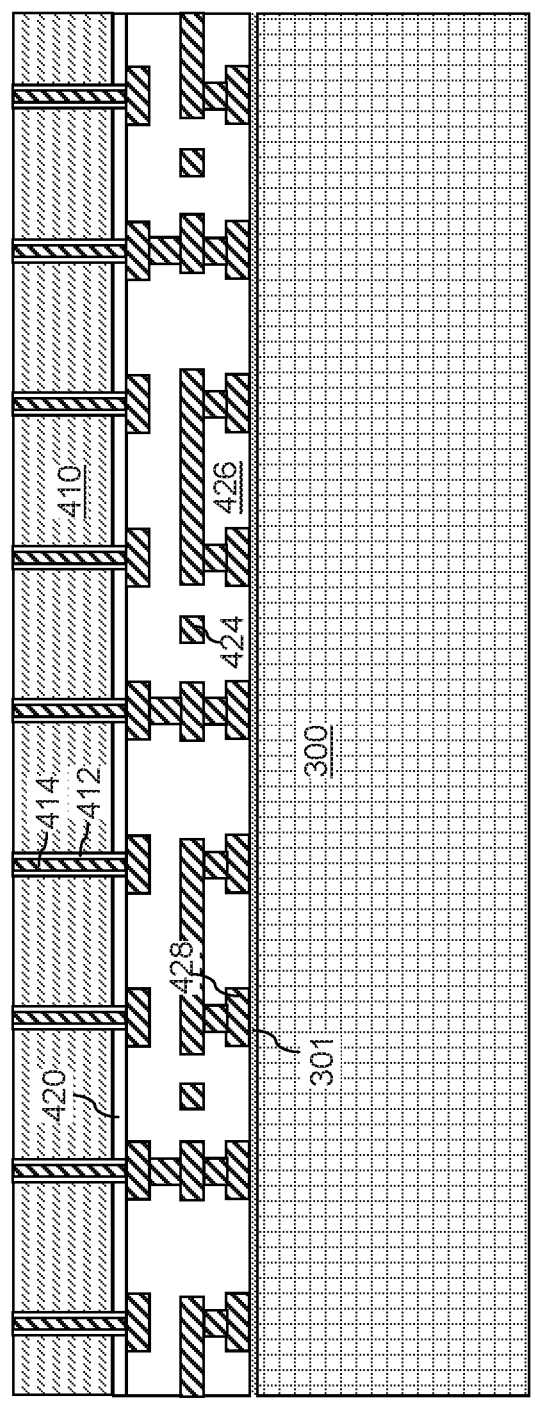

Referring to FIG. 1D, the backside of the silicon substrate 410 may be thinned until bottom surfaces of the TSV structures 414 are physically exposed. The thinning of the silicon substrate 410 may be effected, for example, by grinding, polishing, an isotropic etch process, an anisotropic etch process, or a combination thereof. For example, a combination of a grinding process, an isotropic etch process, and a polishing process may be used to thin the backside of the silicon substrate 410. The thickness of the silicon substrate 410 after thinning may be in a range from 10 microns to 100 microns, such as from 20 microns to 60 microns. The thickness of the silicon substrate 410 after thinning is thick enough to provide sufficient mechanical strength to the silicon substrate 410 after thinning, and is thin enough to physically expose backside surfaces (i.e., bottom surfaces) of the TSV structures 414.

Figure 1E:
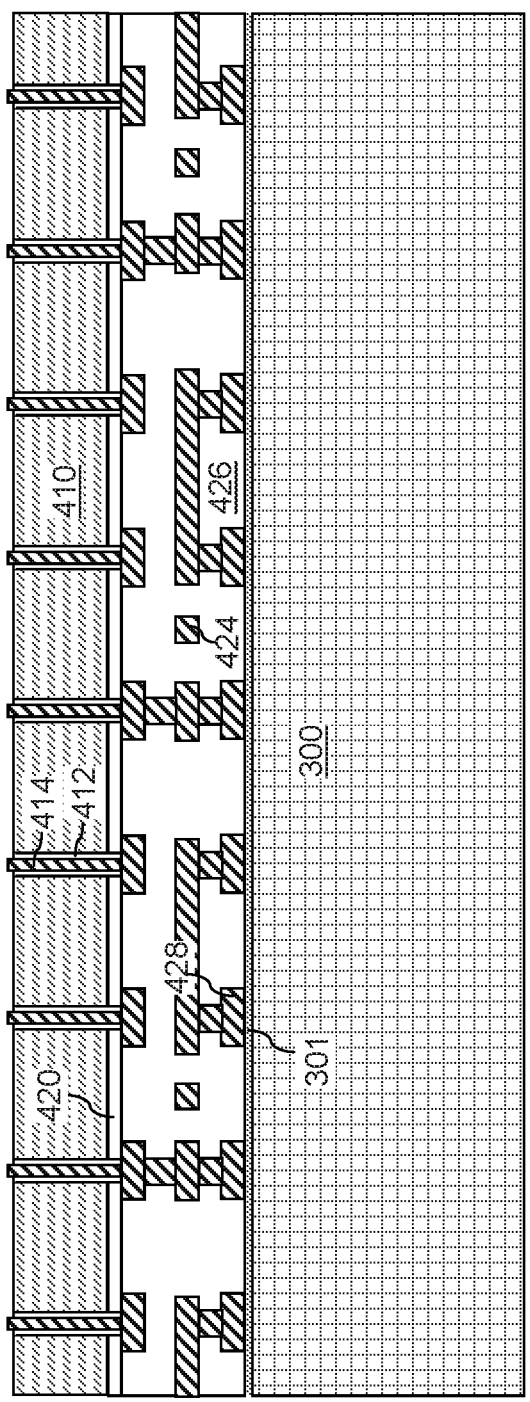

Referring to FIG. 1E, the backside surface of the silicon substrate 410 may be vertically recessed relative to the physically exposed end surfaces of the TSV structures 414 and cylindrical portions of through-substrate insulating spacer 412 that laterally surround a respective one of the TSV structures 414. In one embodiment, a wet etch process that selectively etches silicon in the silicon substrate 410 relative to the metallic material(s) of the TSV structures 414 and the dielectric material of the through-substrate insulating spacer 412 may be used. In an illustrative example, a wet etch process using a KOH solution may be used to vertically recess the backside surface of the silicon substrate 410. The vertical recess distance of the backside surface of the silicon substrate 410 may be in a range from 100 nm to 1,000 nm, such as from 200 nm to 500 nm, although lesser and greater vertical recess distances may also be used.

Figure 1F:
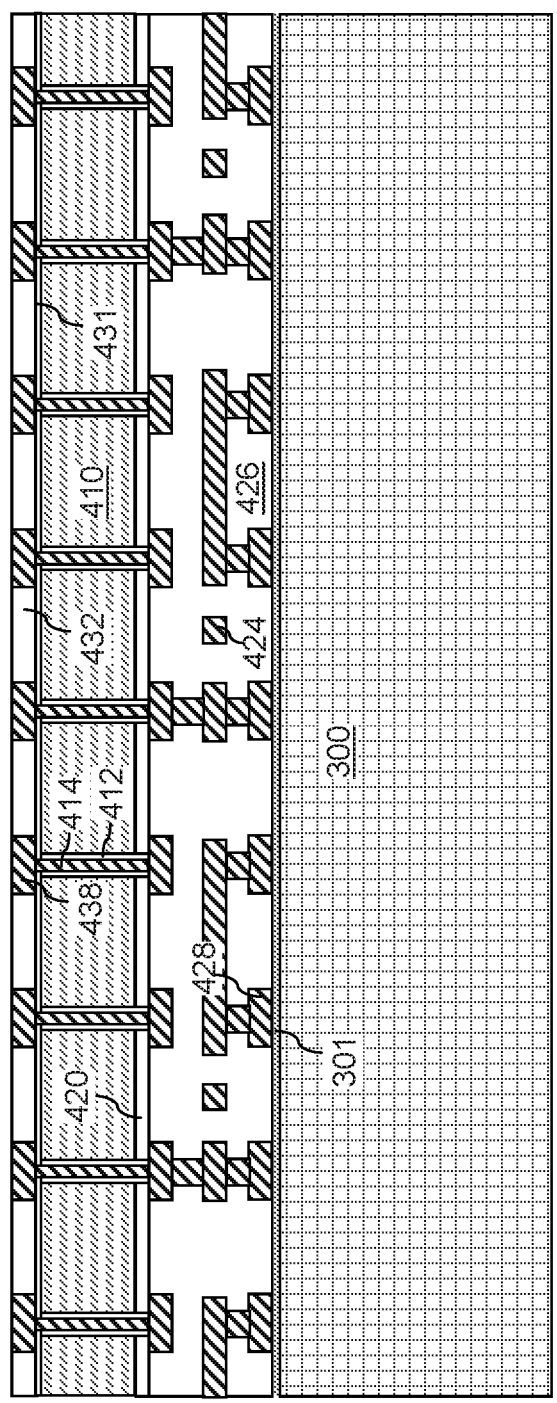

Referring to FIG. 1F, at least one dielectric material such as silicon nitride and/or silicon oxide may be deposited over the recessed backside surface of the silicon substrate 410 and over the physically exposed end surfaces of the TSV structures 414. The at least one dielectric material may be planarized, for example, by chemical mechanical planarization to physically expose the end surfaces of the TSV structures 414. The remaining portions of the at least one dielectric material forms a backside insulating layer 431. The physically exposed horizontal surface of the backside insulating layer 431 may be located within a same horizontal plane as physically exposed end surfaces of the TSV structures 414. The thickness of the backside insulating layer 431 may be in a range from 100 nm to 1,000 nm, such as from 200 nm to 500 nm, although lesser and greater thicknesses may also be used.

Package-side dielectric material layer 432 may be deposited over the backside insulating layer 431 and the array of TSV structures 414. The package-side dielectric material layers 431 can include a dielectric material such as silicon oxide, porous or non-porous organosilicate glass, silicon carbon nitride, silicon nitride, or any other interconnect-level dielectric material known in the art. The thickness of the package-side dielectric material layers 432 may be in a range from 200 nm to 10,000 nm, such as from 400 nm to 5,000 nm, although lesser and greater thicknesses may also be used.

Package-side metal pads 438 can be formed through the backside insulating layer 431 on the backside surfaces of the array of TSV structures 414. In one embodiment, the package-side metal pads 438 may include copper pads or copper pillars that may be employed as microbumps. In one embodiment, the package-side metal pads 438 may have a maximum lateral dimension (such as a diameter) in a range from 10 microns to 50 microns, and may have a height in a range from 5 microns to 50 microns.

Figure 1G:
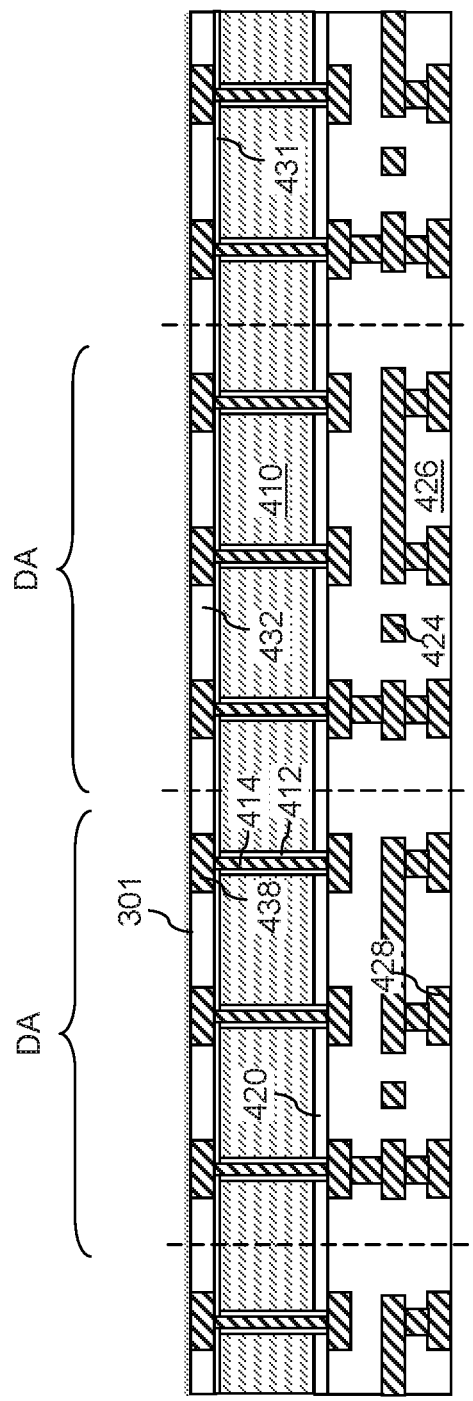

Referring to FIG. 1G, the adhesive layer 301 may be decomposed, for example, by ultraviolet radiation or by a thermal anneal at a debonding temperature. In embodiments in which the carrier substrate 300 includes an optically transparent material and the adhesive layer 301 includes an LTHC layer, the adhesive layer may be decomposed by irradiating ultraviolet light through the transparent carrier substrate. The LTHC layer may be absorb the ultraviolet radiation and generate heat, which decomposes the material of the LTHC layer and cause the transparent carrier substrate to be detached from the assembly including the silicon substrate 410. In embodiments in which the adhesive layer 301 includes a thermally decomposing adhesive material, a thermal anneal process at a debonding temperature may be performed to detach the assembly including the silicon substrate 410 from the carrier substrate 300. The carrier substrate 300 may be detached from the assembly of the silicon substrate 410, the TSV structures 414, the through-substrate insulating spacer 412, the backside insulating layer 431, the die-side metal pads 428, the die-side dielectric material layer 426, the package-side metal pads 438, and the package-side dielectric material layer 432. The assembly including the silicon substrate 410 may be subsequently diced along dicing channels by performing a dicing process. The dicing channels are schematically represented as dotted lines. The dicing channels correspond to the boundaries between neighboring pairs of die areas DA.

Figure 1H:
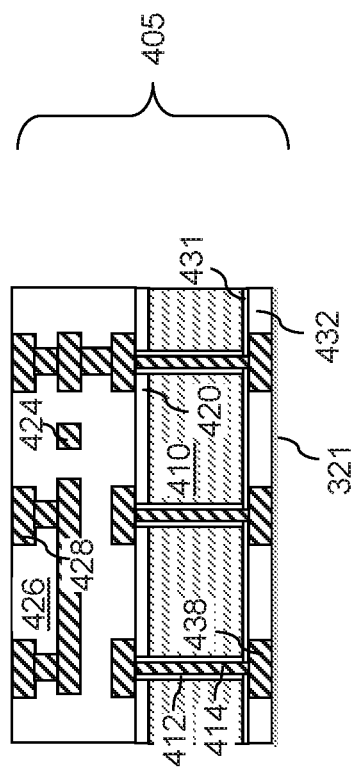

Referring to FIG. 1H, each diced portion of the assembly including the silicon substrate 410 constitutes a bridge die 405. A die attach film (DAF) 321 may be attached to the physically exposed planar surfaces of the package-side metal pads 438 and the package-side dielectric material layer 432 of each bridge die 405. In an alternative embodiment, the DAF 321 may be applied to the planar surfaces of the package-side metal pads 438 and the package-side dielectric material layer 432 prior to dicing of the assembly including the silicon substrate 410 into the bridge dies 405.

In one embodiment, a double-side thermal release tape may be used to provide the DAF 321. For example, the double-side thermal release tape may be provided as a five-layer stack that includes a first release liner, a pressure-sensitive adhesive, a polyester film, a thermal-release adhesive, and a second release liner. The first release liner may be peeled off and discarded, and the pressure-sensitive adhesive of the DAF 321 may be attached to the physically exposed planar surfaces of the package-side metal pads 438 and the package-side dielectric material layer 432 by pressing down. The second release layer may be subsequently removed. The DAF may include a stack including, from bottom to top, the pressure-sensitive adhesive, the polyester film, and the thermal-release adhesive. In an illustrative example, the thickness of the pressure-sensitive adhesive may be about 10 microns, the thickness of the polyester film may be in a range from 50 microns to 100 microns, and the thickness of the thermal-release adhesive may be in a range from 30 microns to 60 microns. The debonding temperature of the thermal-release adhesive may be about 170 degrees Celsius. An example of a commercially available double-side thermal release tape is Revalpha™ provided by Nitto Denko™. Each bridge die 405 may include a silicon substrate 410, TSV structures 414, a through-substrate insulating spacer 412, a backside insulating layer 431, die-side metal pads 428, a die-side dielectric material layer 426, package-side metal pads 438, a package-side dielectric material layer 432, and a DAF 321. As discussed above, in some embodiments, the package side dielectric material layer 432 may be a unitary structure with the backside insulating layer 431. A first surface of each DAF 321 may be attached to the package-side metal pads 438 of a respective bridge die 405.

Figure 2A:
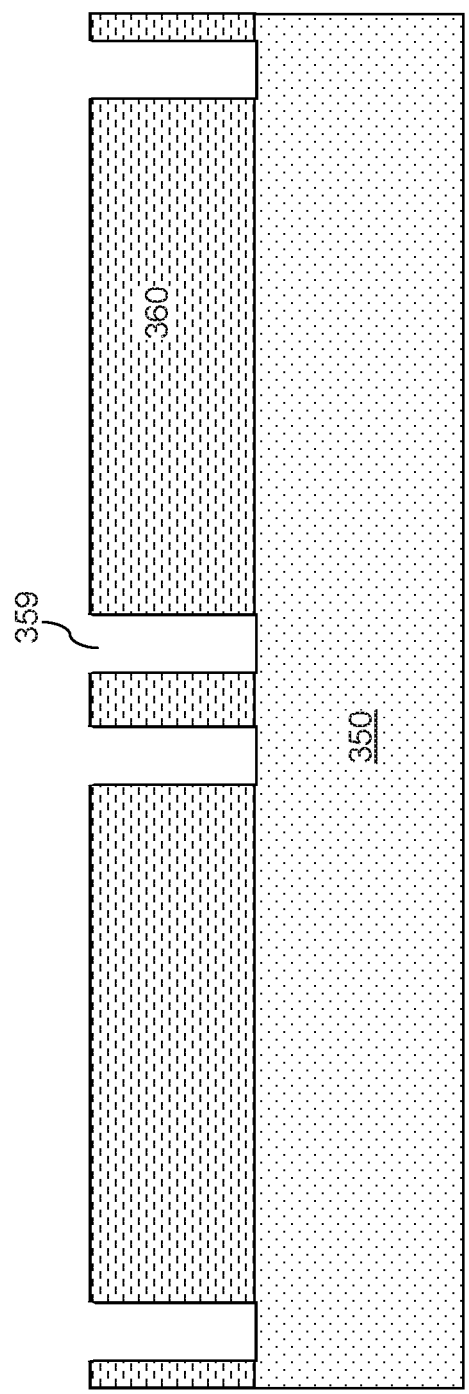
FIG. 2A is a vertical cross-sectional view of a region of an exemplary structure including a first carrier substrate, a sacrificial matrix layer, and an array of via cavities extending through the sacrificial matrix layer according to an embodiment of the present disclosure.
Figure 2B:
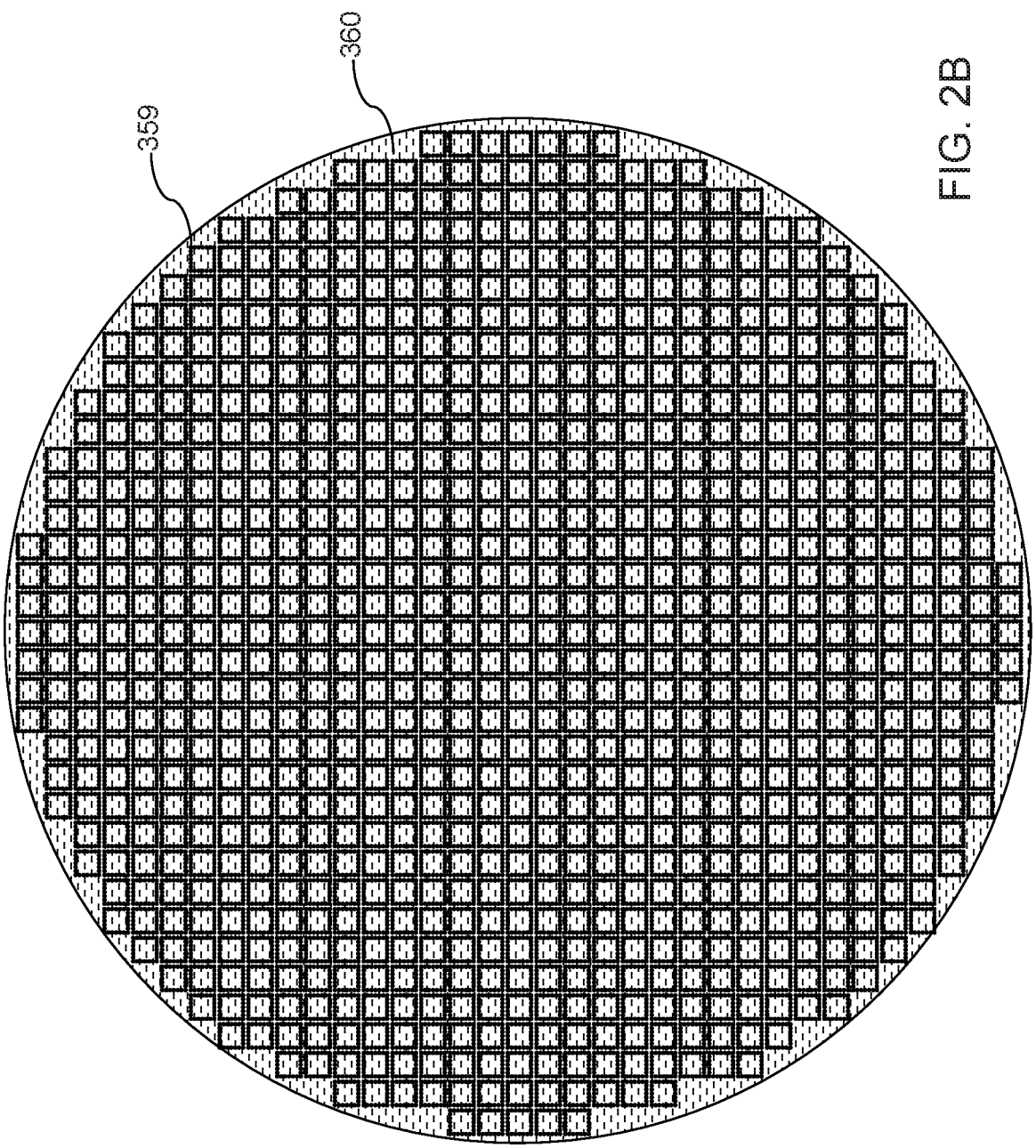
FIG. 2B is a top-down view of the exemplary structure of FIG. 2A.
Figure 2C:
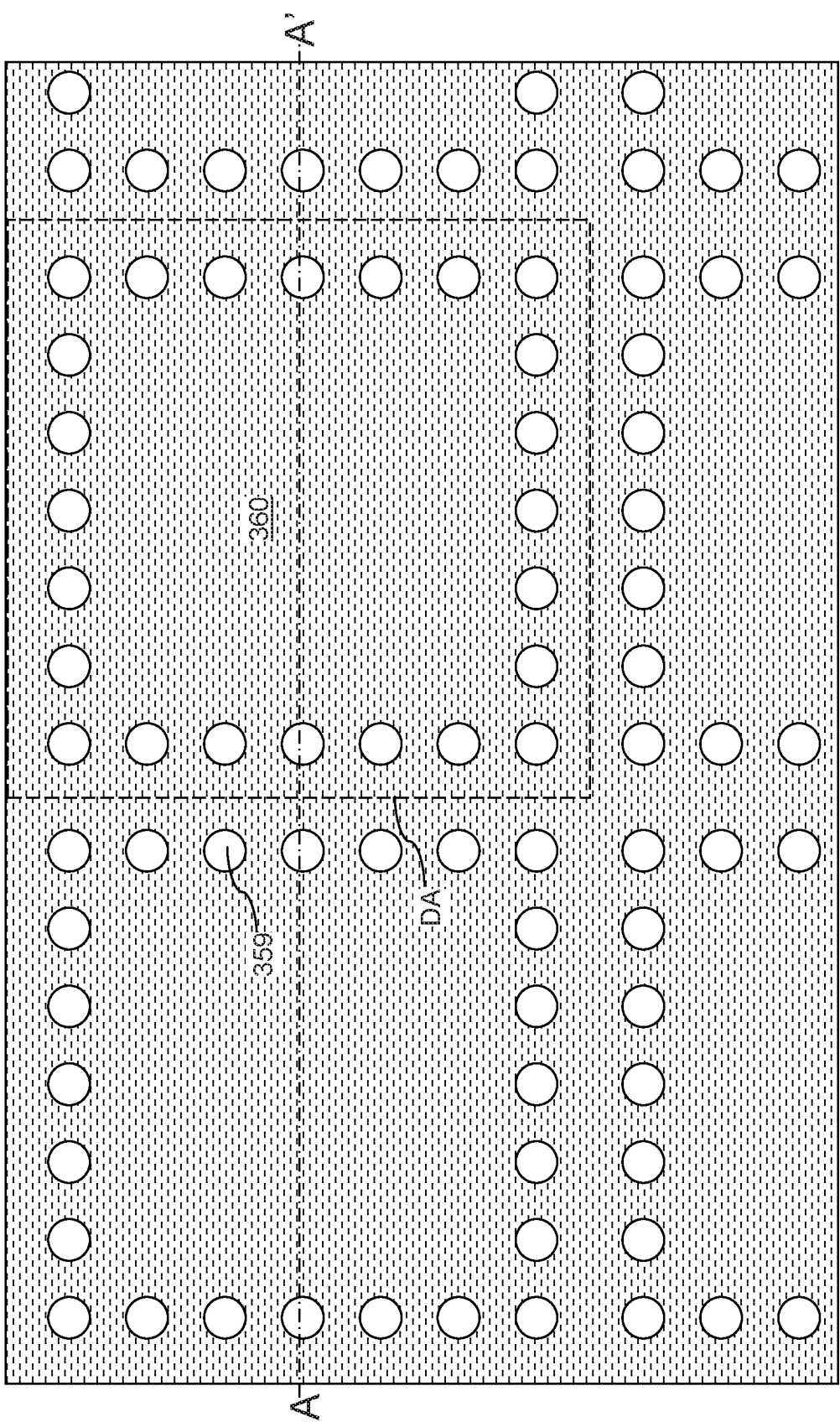
FIG. 2C is a top-down view of a region of the exemplary structure of FIGS. 2A and 2B. The vertical plane A-A' is the plane of the vertical cross-sectional view of FIG. 2A.

Referring to FIGS. 2A-2C, a first carrier substrate 350 is illustrated, which may be a transparent carrier substrate (such as a glass substrate or a sapphire substrate). In one embodiment, the first carrier substrate 350 may have a diameter in a range from 150 mm to 450 mm, or may be provided as a panel such as rectangular panel. A sacrificial matrix layer 360 may be formed over the first carrier substrate 350. The sacrificial matrix layer 360 may include a material that may be removed selective to the material of the first carrier substrate 350. For example, if the first carrier substrate 350 includes a transparent dielectric material or a metal, the sacrificial matrix layer 360 may include a semiconductor material such as polysilicon or a polymer material. The thickness of the sacrificial matrix layer 360 may be about the same as the thickness of the bridge die 405. For example, the thickness of the sacrificial matrix layer 360 may be in a range from 50 microns to 400 microns, such as from 100 microns to 200 microns, although lesser and greater thicknesses may also be used.

A photoresist layer (not shown) may be applied over the top surface of the sacrificial matrix layer 360, and may be lithographically patterned to form an array of openings within each die area DA. The die areas DA may be arranged as a rectangular periodic array across the first carrier substrate 350. The pattern of the openings within each die area DA may be arranged such that the openings laterally surround an area in which a bridge die 405 is to be subsequently placed. The pattern of the openings in the photoresist layer may be transferred through the sacrificial matrix layer 360 using an anisotropic etch process that etches the material of the sacrificial matrix layer 360 selective to the material of the first carrier substrate 350. An array of via cavities 359 may be formed through the sacrificial matrix layer 360 within each die area. The photoresist layer may be subsequently removed, for example, by ashing.

In one embodiment, via cavities 359 within each die area DA may be arranged such that the via cavities 359 laterally surrounds a rectangular area that is greater than the size of a bridge die provided at the processing steps of FIG. 1G. The lateral dimension (such as the diameter) of each via cavity 359 may be in a range from 10 microns to 120 microns, such as from 20 microns to 60 microns, although lesser and greater lateral dimensions may also be used.

Figure 3A:
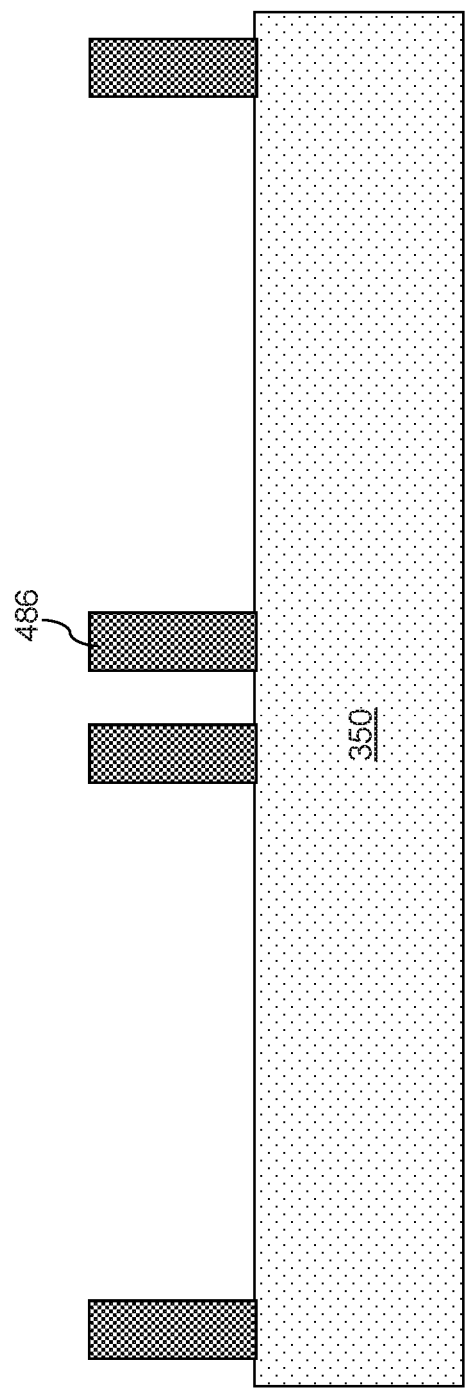
FIG. 3A is a vertical cross-sectional view of a region of the exemplary structure after formation of through-integrated-fan-out via (TIV) structures according to an embodiment of the present disclosure.
Figure 3B:
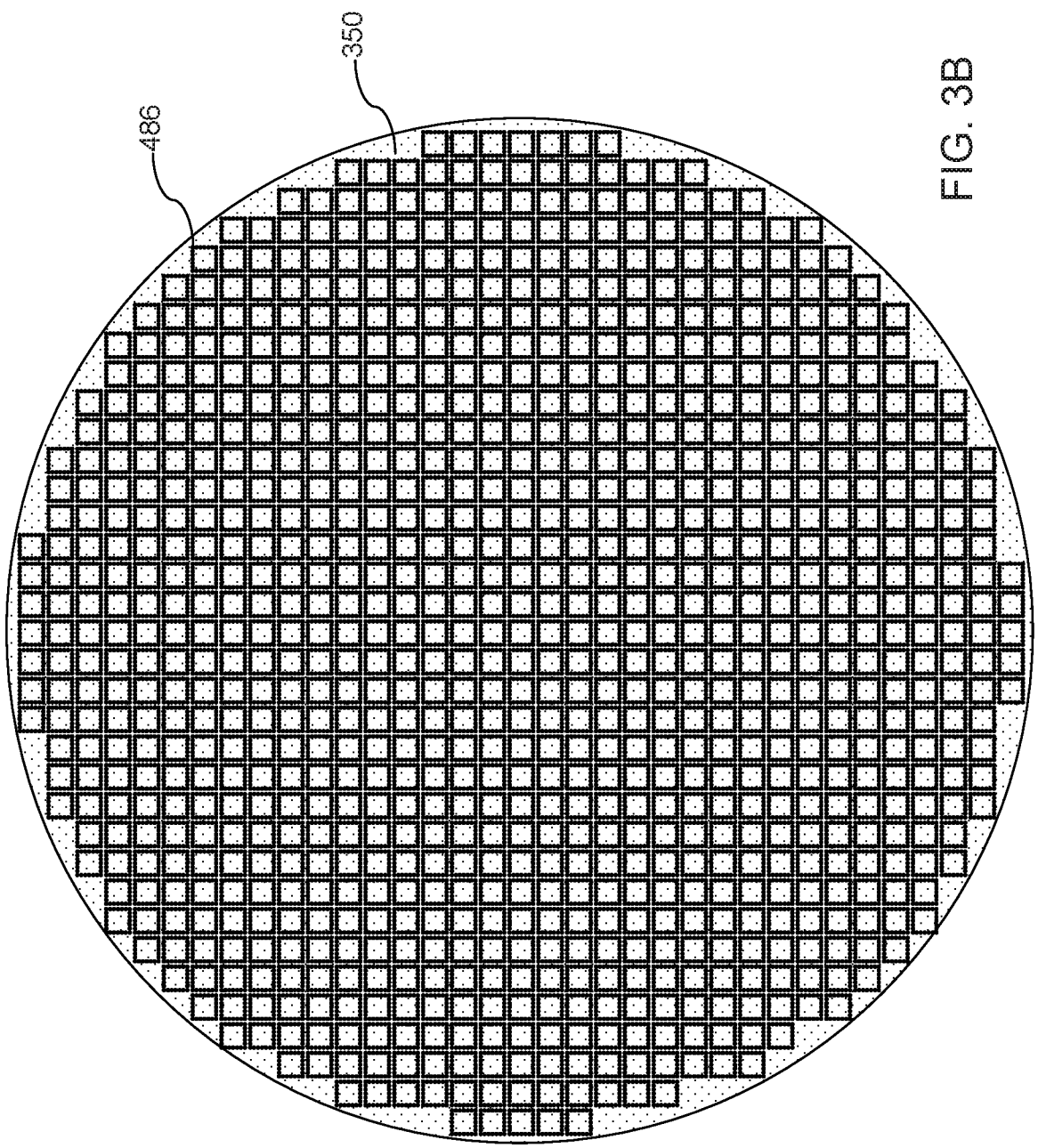
FIG. 3B is a top-down view of the exemplary structure of FIG. 3A.
Figure 3C:
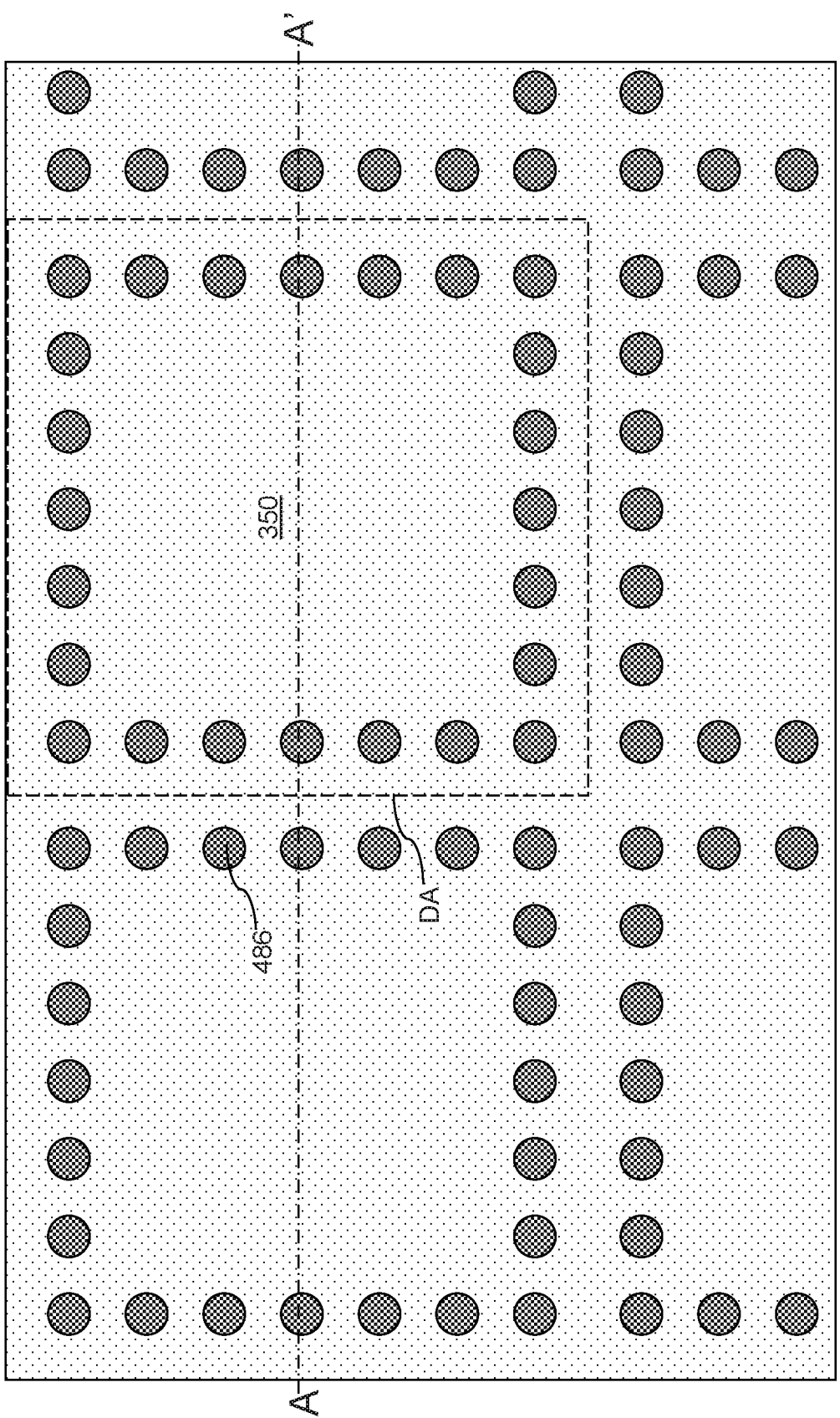
FIG. 3C is a top-down view of a region of the exemplary structure of FIGS. 3A and 3B. The vertical plane A-A' is the plane of the vertical cross-sectional view of FIG. 3A.

Referring to FIGS. 3A-3C, at least one conductive material such as a combination of a metallic nitride liner material (e.g., TiN, TaN, WN, or a combination thereof) and a metallic fill material (such as W, Mo, Co, Ru, Cu, or any other transition metal) may be deposited in the via cavities 359 formed through the sacrificial matrix layer 360. Excess portions of the at least one conductive material may be removed from above the horizontal plane including the top surface of the sacrificial matrix layer 360 by performing a planarization process such as a chemical mechanical planarization process. Remaining portions of the at least one conductive material that fill the via cavities 359 constitute through-integrated-fan-out via (TIV) structures 486, which are conductive via structures that vertically extend through the fan-out silicon interposer to be subsequently completed.

The sacrificial matrix layer 360 may be subsequently removed selective to the first carrier substrate 350 and the TIV structures 486. For example, if the first carrier substrate 350 includes a glass substrate or a sapphire substrate, and if the sacrificial matrix layer 360 includes a semiconductor material such as polysilicon, a wet etch process using a KOH solution may be performed to remove the sacrificial matrix layer 360 selective to the first carrier substrate 350 and the TIV structures 486.

Figure 4A:
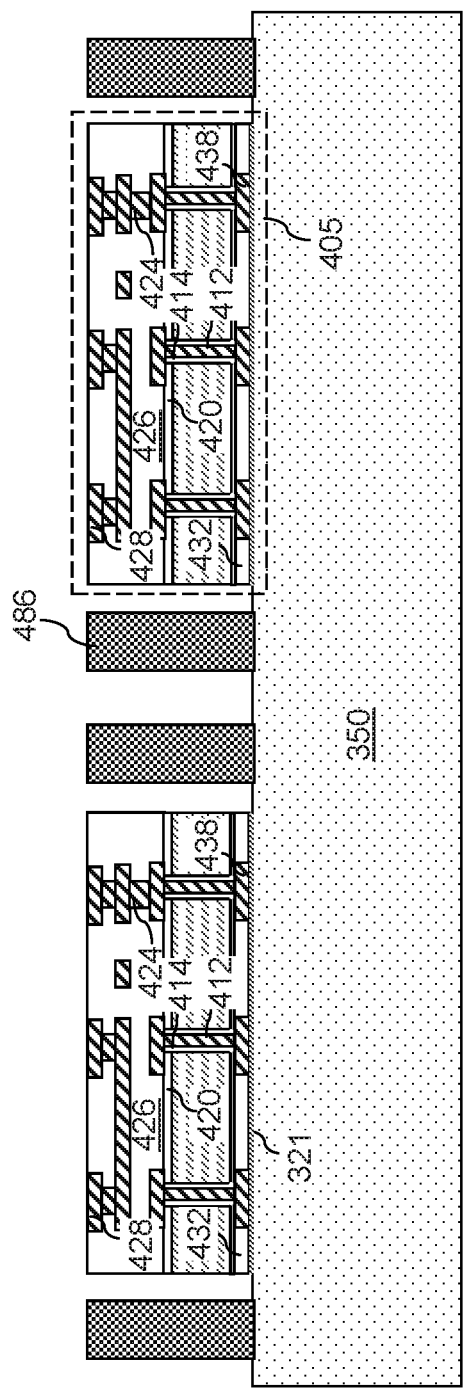
FIG. 4A is a vertical cross-sectional view of a region of the exemplary structure after attaching bridge dies to the first carrier substrate according to an embodiment of the present disclosure.
Figure 4C:
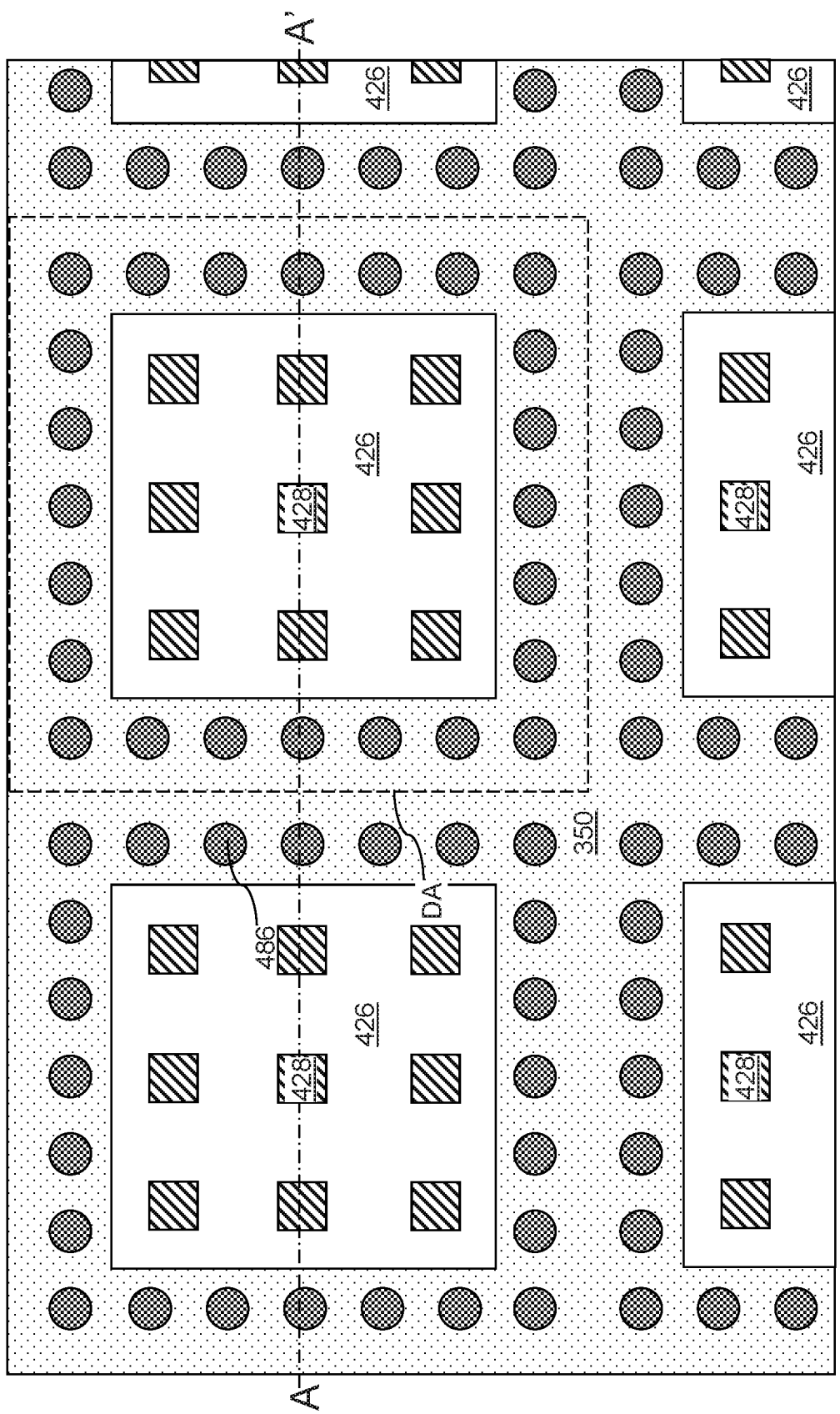
FIG. 4C is a top-down view of a region of the exemplary structure of FIGS. 4A and 4B. The vertical plane A-A' is the plane of the vertical cross-sectional view of FIG. 4A.

Referring to FIGS. 4A-4C, the bridge dies 405 provided at the processing steps of FIG. 1G may be attached to the first carrier substrate 350 such that the DAF 321 contacts the top surface of the first carrier substrate 350. A second surface of each DAF 321 may be attached to the first carrier substrate 350. Each bridge die 405 may be placed within a respective die area DA, and may be laterally surrounded by a respective array of TIV structures 486. Each bridge die 405 may be disposed over the first carrier substrate 350 such that the package-side metal pads 438 are more proximal to the first carrier substrate 350 interposer than the TSV structures 414 are to the first carrier substrate 350.

Placement of the bridge dies 405 on the first carrier substrate 350 may be performed using a pick and place apparatus. The overlay variations in the alignment of a bridge die 405 to an array of TIV structures 486 within the die area DA in which the bridge die 405 is placed may be determined by the overlay accuracy of the pick and place apparatus that is used to place the bridge die 405. Typical commercially available pick and place apparatuses provide overlay variations on the order of 5 microns, although more expensive pick and place apparatuses may provide lesser overlay variations. Each bridge die 405 may be attached to the first carrier substrate 350 through a respective DAF 321.

Figure 5:
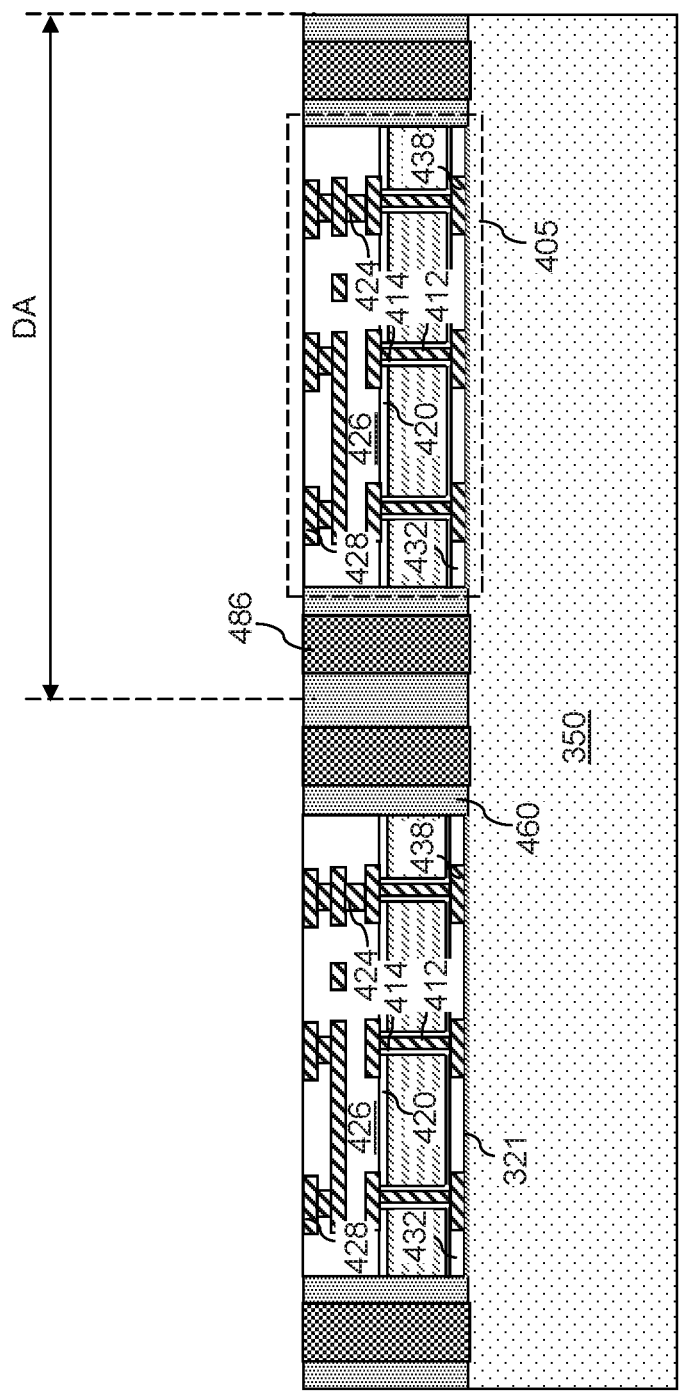
FIG. 5 is a vertical cross-sectional view of a region of the exemplary structure after formation of an epoxy molding compound (EMC) interposer frame around each bridge die according to an embodiment of the present disclosure.

Referring to FIG. 5, an encapsulant, such as an epoxy molding compound (EMC) may be applied to the gaps between the bridge dies 405 and the TIV structures 486. The EMC includes an epoxy-containing compound that may be hardened (i.e., cured) to provide a dielectric material portion having sufficient stiffness and mechanical strength. The EMC may include epoxy resin, hardener, silica (as a filler material), and other additives. The EMC may be provided in a liquid form or in a solid form depending on the viscosity and flowability. Liquid EMC typically provides better handling, good flowability, less voids, better fill, and less flow marks. Solid EMC typically provides less cure shrinkage, better stand-off, and less die drift. A high filler content (such as 85% in weight) within an EMC may shorten the time in mold, lower the mold shrinkage, and reduce the mold warpage. Uniform filler size distribution in the EMC may reduce flow marks, and may enhance flowability. The curing temperature of the EMC may be lower than the release (debonding) temperature of the DAF 321. For example, the curing temperature of the EMC may be in a range from 125° C. to 150° C.

The EMC may be cured at a curing temperature to form an EMC matrix that laterally encloses each of the bridge dies 405 and the TIV structures 486. The EMC matrix includes a plurality of epoxy molding compound (EMC) interposer frames 460 that are laterally adjoined to one another. Each EMC interposer frame 460 is located within a respective die area DA, and laterally surrounds and may be formed around a respective bridge die 405 and a respective array of TIV structures 486. Excess portions of the EMC may be removed from above the horizontal plane including the top surfaces of the bridge die 405 and the TIV structures 486 by a planarization process, which may use chemical mechanical planarization.

Figure 6:
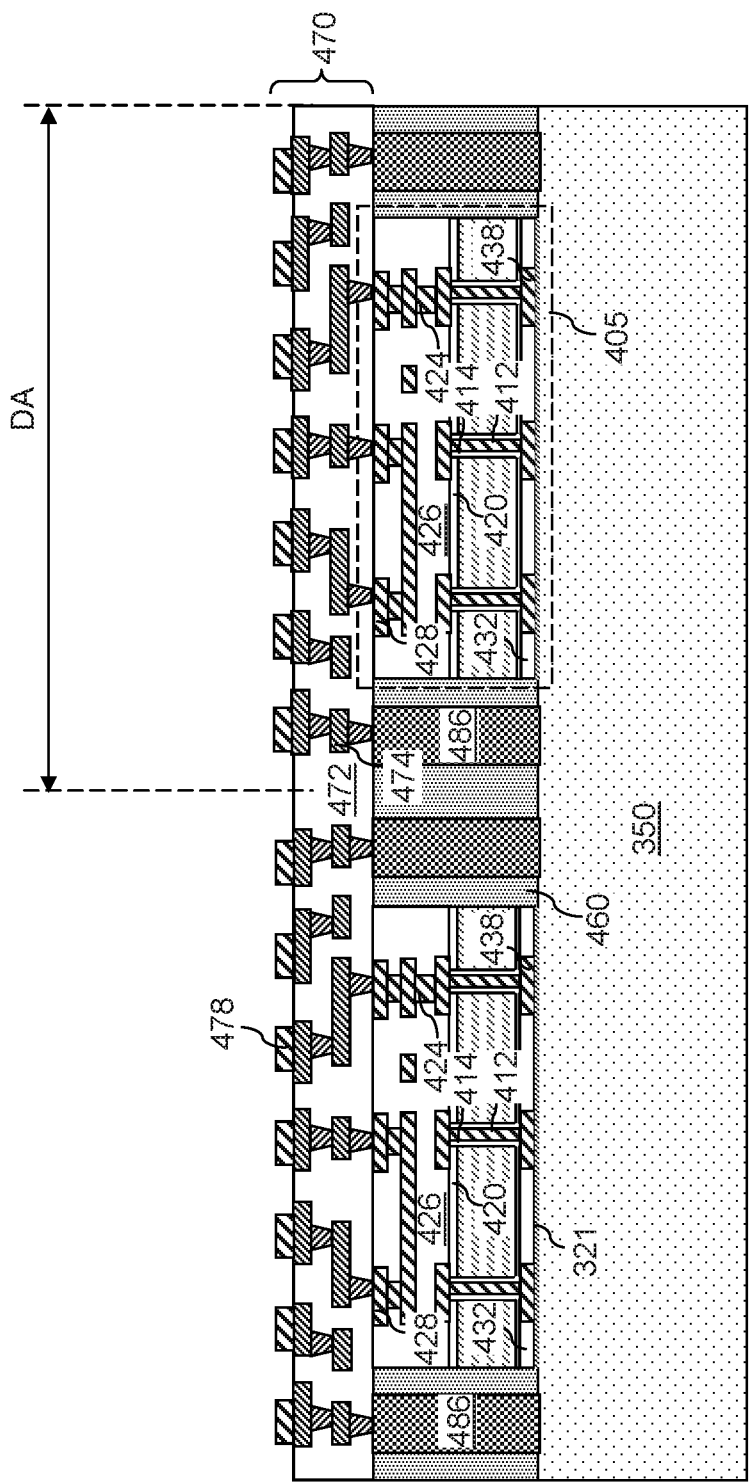
FIG. 6 is a vertical cross-sectional view of a region of the exemplary structure after formation of die-side redistribution structures according to an embodiment of the present disclosure.

Referring to FIG. 6, die-side redistribution structures 470 may be formed on the bridge dies 405 and the TIV structures 486. Specifically, a die-side redistribution structure 470 may be formed within each die area DA of the assembly including the bridge dies 405, the EMC interposer frames 460, and the TIV structures 486. The die-side redistribution structures 470 are redistribution structures that are formed on the die side, i.e., the side that faces semiconductor dies to be subsequently attached, with respect to the assembly of the bridge dies 405, the EMC interposer frames 460, and the TIV structures 486.

Each die-side redistribution structure 470 may include die-side redistribution dielectric layers 472, die-side redistribution wiring interconnects 474, and die-side bonding pads 478. The die-side redistribution dielectric layers 472 include a respective dielectric polymer material such as polyimide (PI), benzocyclobutene (BCB), or polybenzobisoxazole (PBO). Each die-side redistribution dielectric layer 472 may be formed by spin coating and drying of the respective dielectric polymer material. The thickness of each die-side redistribution dielectric layer 472 may be in a range from 2 microns to 40 microns, such as from 4 microns to 20 microns. Each die-side redistribution dielectric layer 472 may be patterned, for example, by applying and patterning a respective photoresist layer thereabove, and by transferring the pattern in the photoresist layer into the die-side redistribution dielectric layer 472 using an etch process such as an anisotropic etch process. The photoresist layer may be subsequently removed, for example, by ashing.

Each of the die-side redistribution wiring interconnects 474 and the die-side bonding pads 478 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 300 nm, and the copper seed layer may have a thickness in a range from 100 nm to 500 nm. The metallic fill material for the die-side redistribution wiring interconnects 474 may include copper, nickel, or copper and nickel. The thickness of the metallic fill material that is deposited for each die-side redistribution wiring interconnect 474 may be in a range from 2 microns to 40 microns, such as from 4 microns to 10 microns, although lesser or greater thicknesses may also be used. The total number of levels of wiring in each die-side redistribution structure 470 (i.e., the levels of the die-side redistribution wiring interconnects 474) may be in a range from 1 to 10.

The metallic fill material for the die-side bonding pads 478 may include copper. The thickness of the metallic fill material that is deposited for the die-side bonding pads 478 may be in a range from 5 microns to 100 microns, although lesser or greater thicknesses may also be used. The die-side bonding pads 478 may have horizontal cross-sectional shapes of rectangles, rounded rectangles, or circles. If the die-side bonding pads 478 are formed as C4 (controlled collapse chip connection) pads, the thickness of the die-side bonding pads 478 may be in a range from 5 microns to 50 microns, although lesser or greater thicknesses may also be used. Alternatively, the die-side bonding pads 478 may be configured for microbump bonding (i.e., C2 bonding), and may have a thickness in a range from 30 microns to 100 microns, although lesser or greater thicknesses may also be used. In such an embodiment, the die-side bonding pads 478 may be formed as an array of microbumps (such as copper pillars) having a lateral dimension in a range from 10 microns to 25 microns, and having a pitch in a range from 20 microns to 50 microns.

Figure 7:
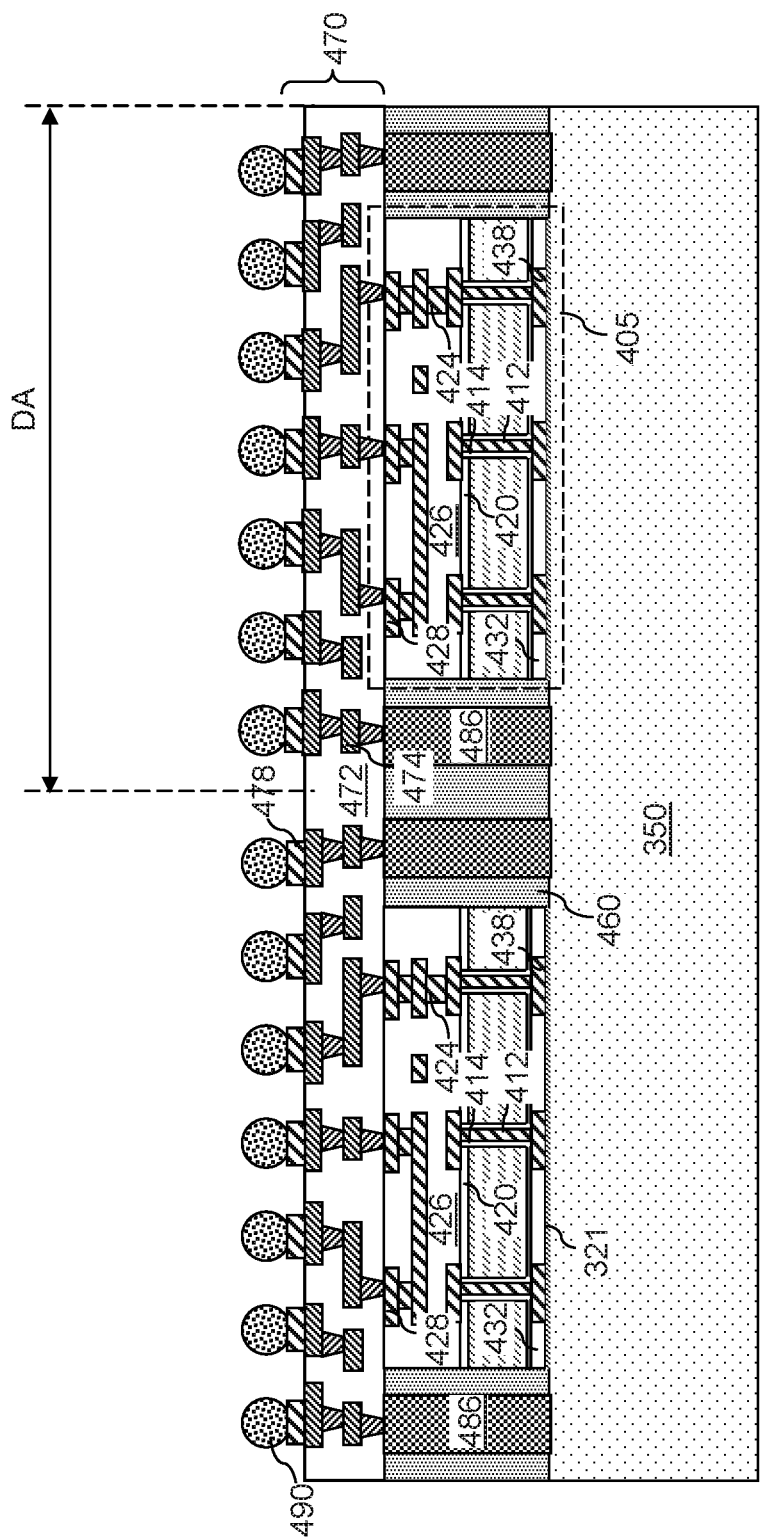
FIG. 7 is a vertical cross-sectional view of a region of the exemplary structure after attaching solder material portions according to an embodiment of the present disclosure.

Referring to FIG. 7, solder material portions 490 may be attached to the die-side bonding pads 478. In embodiments in which the die-side bonding pads 478 include C4 bonding pads, the solder material portions 490 may be C4 solder balls, i.e., solder material portions in the shapes of balls that may be used for C4 bonding. In embodiments in which the die-side bonding pads 478 include an array of microbumps for C2 bonding, the solder material portions 490 may be solder caps that wet the entirety of a planar end surface of a respective microbump and have generally hemispherical shapes. In one embodiment, the solder material portions 490 may comprise an array of cylindrical copper pillars each having a horizontal cross-sectional shape of a circle with a diameter in a range from 10 microns to 25 microns. While the present disclosure is described using an embodiment in which the solder material portions 490 are represented by spherical C4 solder balls, embodiments are expressly contemplated herein in which the solder material portions 490 are solder caps having hemispherical shapes.

Figure 8:
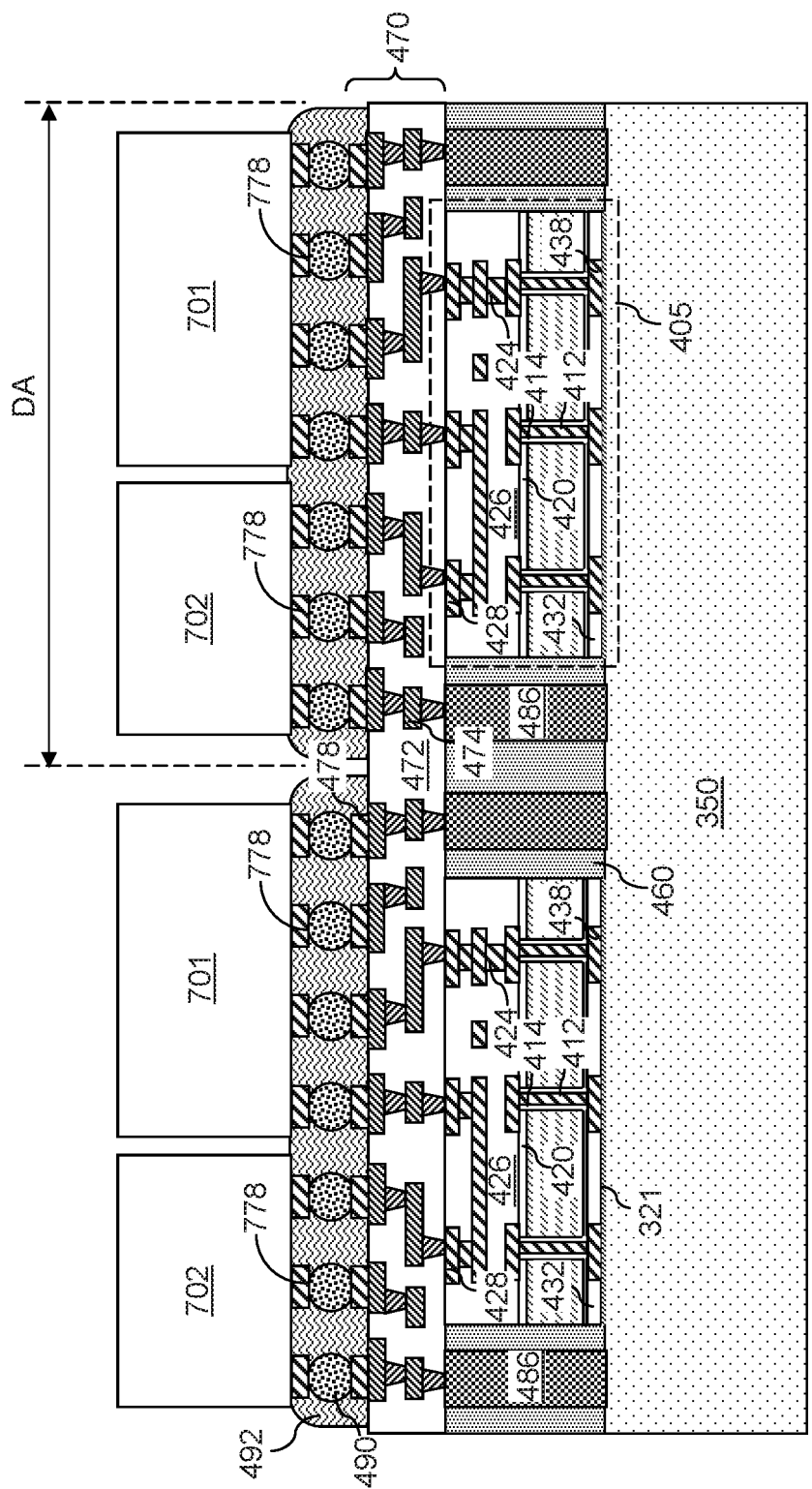
FIG. 8 is a vertical cross-sectional view of a region of the exemplary structure after attaching semiconductor dies to the die-side bonding pads according to an embodiment of the present disclosure.

Referring to FIG. 8, at least one semiconductor die (701, 702) may be attached to each die-side redistribution structure 470, which is located within a respective die area DA. Thus, at least one semiconductor die (701, 702) may be electrically connected to a respective bridge die 405 located within a respective die area DA. Each semiconductor die (701, 702) may be bonded to a respective subset of the die-side bonding pads 478 through a respective subset of the solder material portions 490. In one embodiment, at least one semiconductor die (701, 702) may be attached to the die-side redistribution structure 470 through an array of microbumps. In one embodiment, a plurality of semiconductor dies (701, 702) may be attached to the die-side redistribution structure 470 through an array of microbumps or through arrays of microbumps. In such an embodiment, at least one of the semiconductor dies (701, 702) includes an array of microbumps 778 having the same pitch as the die-side bonding pads 478, which include another array of microbumps. A C2 bonding process that reflows the solder material portions 490 may be performed after each array of microbumps 778 of the at least one of the semiconductor dies (701, 702) is disposed over the array of solder material portions 490.

At least one underfill material portion 492 may be formed around each bonded array of solder material portions 490. Each underfill material portion 492 may be formed by injecting an underfill material around the array of solder material portions 490 after the solder material portions 490 are reflowed. Any known underfill material application method may be used, which may be, for example, the capillary underfill method, the molded underfill method, or the printed underfill method. In one embodiment, a plurality of semiconductor dies (701, 702) may be attached to a die-side redistribution structure 470 within each die area DA, and a single underfill material portion 492 may continuously extend underneath the plurality of semiconductor dies (701, 702).

The at least one semiconductor die (701, 702) may include any semiconductor die known in the art. In one embodiment, the at least one semiconductor die (701, 702) may include a system-on-chip (SoC) die such as an application processor die. In one embodiment, the at least one semiconductor die (701, 702) may include a plurality of semiconductor dies (701, 702). In one embodiment, the plurality of semiconductor dies (701, 702) may include a first semiconductor die 701 and at least one second semiconductor die 702. In one embodiment, the first semiconductor die 701 may be a central processing unit die, and the at least one second semiconductor die 702 may include a graphic processing unit die. In another embodiment, the first semiconductor die 701 may include a system-on-chip (SoC) die, and the at least one second semiconductor die 702 may include at least one high bandwidth memory (HBM) die, each of which includes a vertical stack of static random access memory dies and provides high bandwidth as defined under JEDEC standards, i.e., standards defined by The JEDEC Solid State Technology Association. The top surfaces of the semiconductor dies (701, 702) that are attached to the die-side redistribution structures 470 may be positioned within a same horizontal plane.

The die-side metal interconnect structures 424 can be employed as segments of high-speed inter-die electrically conductive paths between the semiconductor dies (701, 702). Specifically, the combination of the die-side redistribution wire interconnects 474 and the die-side metal interconnect structures 424 can be employed to enable high-speed signal transmission between the semiconductor dies (701, 702). In one embodiment, the semiconductor dies (701, 702) may include a system-on-chip (SoC) die and at least one high bandwidth memory die, and the combination of the die-side redistribution wire interconnects 474 and the die-side metal interconnect structures 424 may be employed to provide high speed communication between the system-on-chip die and the at least one high bandwidth memory die. Additionally or alternatively, In one embodiment, the semiconductor dies (701, 702) may include a graphic processing unit (GPU) and at least one high bandwidth memory die, and the combination of the die-side redistribution wire interconnects 474 and the die-side metal interconnect structures 424 may be employed to provide high speed communication between the graphic processing unit and the at least one high bandwidth memory die.

Figure 9:
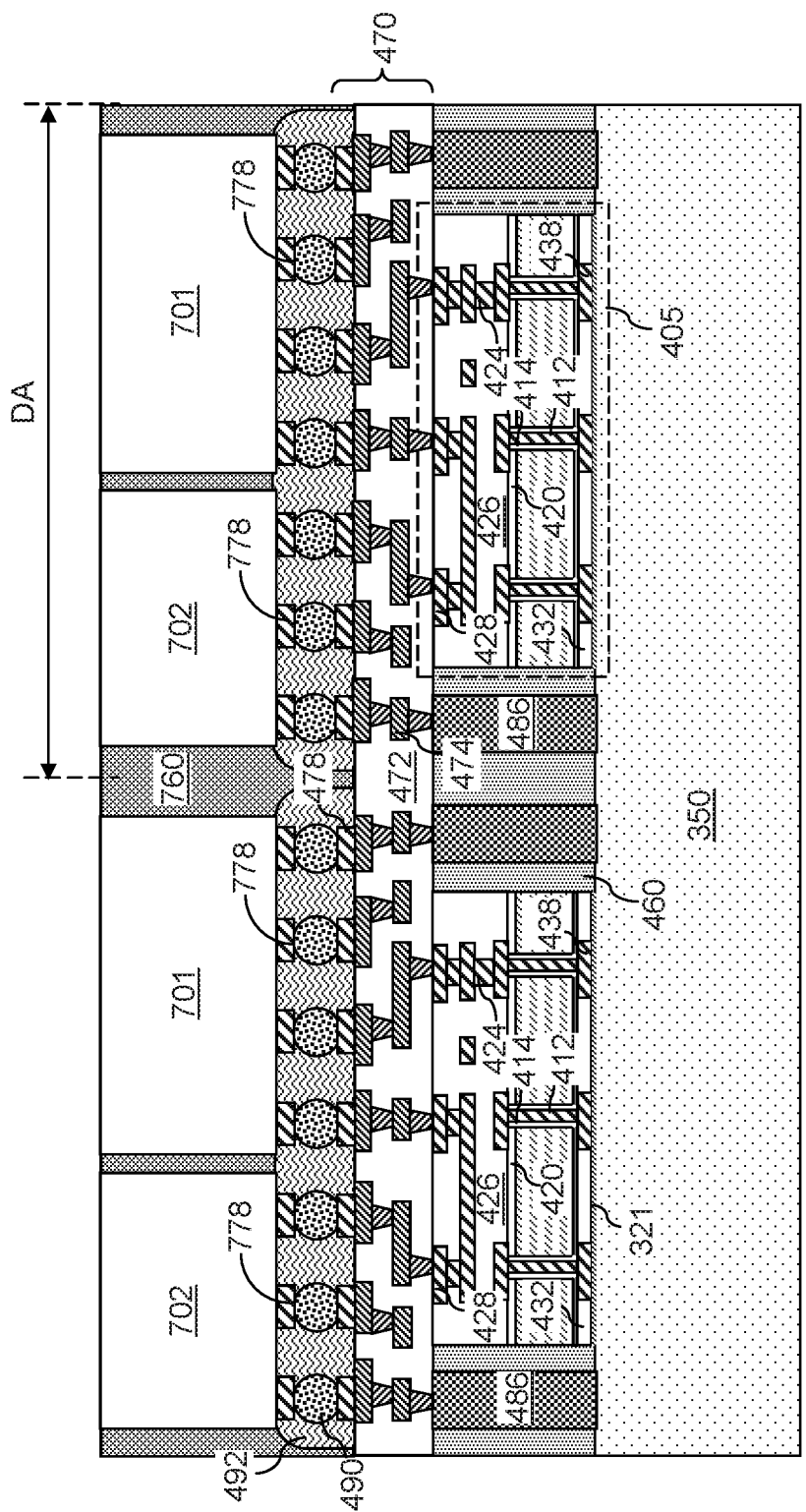
FIG. 9 is a vertical cross-sectional view of a region of the exemplary structure after forming epoxy molding compound (EMC) die frames according to an embodiment of the present disclosure.

Referring to FIG. 9, another encapsulant, such as an epoxy molding compound (EMC) is applied to the gaps between the semiconductor dies (701, 702). The EMC applied at this processing step may use any of the EMC materials that may be used to form the EMC interposer frames 460 as described above. The EMC is cured at a curing temperature to form an EMC matrix that laterally encloses each of the semiconductor dies (701, 702). The EMC matrix includes a plurality of epoxy molding compound (EMC) die frames 760 that are laterally adjoined to one another. Each EMC die frame 760 is located within a respective die area DA, and laterally surrounds and may be formed around a respective set of at least one semiconductor die (701, 702) that is bonded to an underlying die-side redistribution structure 470. Excess portions of the EMC may be removed from above the horizontal plane including the top surfaces of the semiconductor dies (701, 702) by a planarization process, which may use chemical mechanical planarization. Generally, each EMC die frame 760 laterally surrounds at least one semiconductor die (701, 702).

Figure 10:
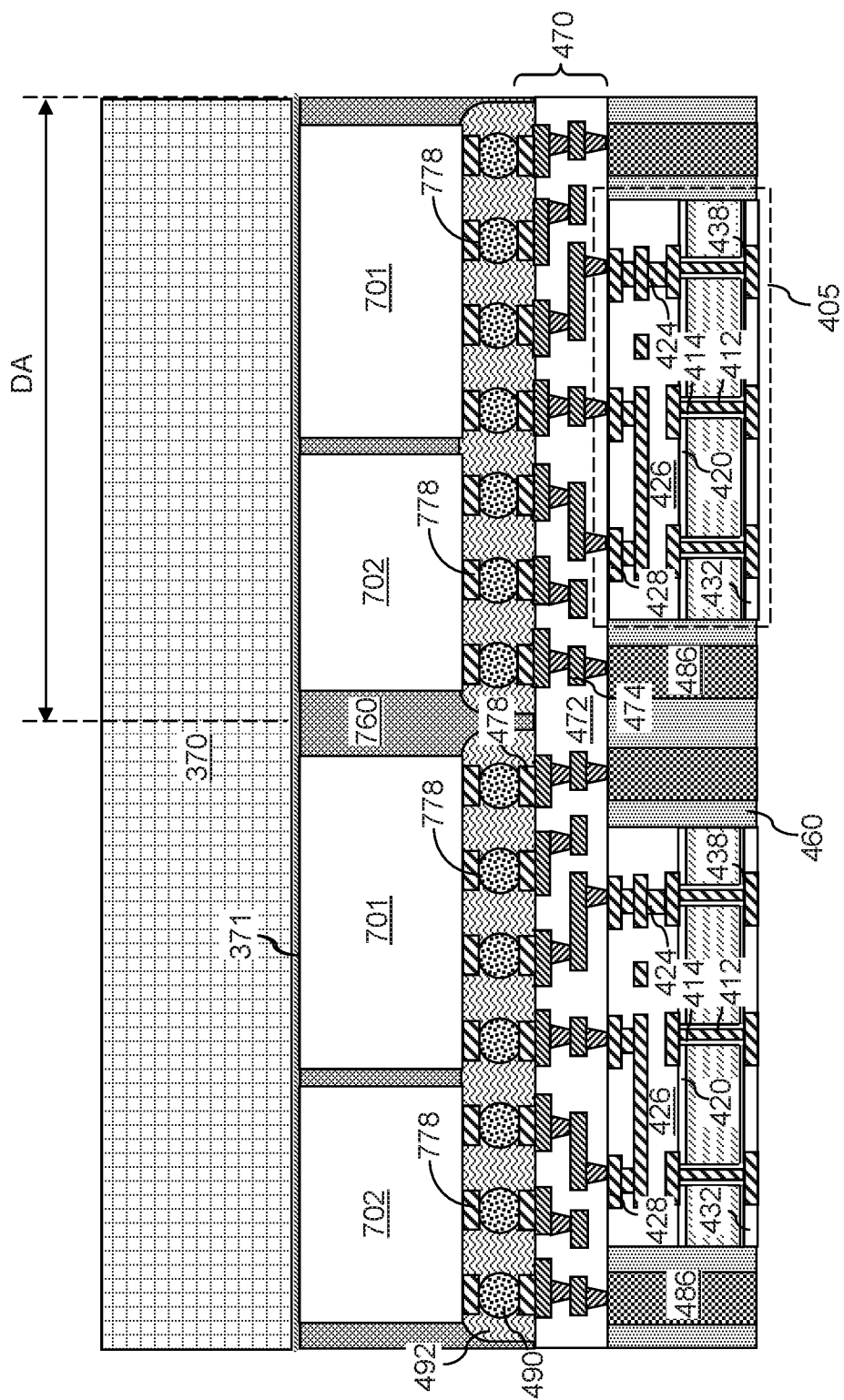
FIG. 10 is a vertical cross-sectional view of a region of the exemplary structure after attaching a second carrier substrate to the semiconductor dies and after detaching the first carrier substrate according to an embodiment of the present disclosure.

Referring to FIG. 10, a second carrier substrate 370 may be attached to the semiconductor dies (701, 702) and the EMC die frames 760. A suitable temporary adhesive layer 371 may be used. The temporary adhesive layer 371 may include a light-to-heat conversion (LTHC) layer if the second carrier substrate 370 includes an optically transparent material. Alternatively, the temporary adhesive layer 371 may include a thermally deactivated adhesive material. Subsequently, the die attachment films 321 between the bridge dies 405 and the first carrier substrate 350 may be debonded, for example, by performing a thermal anneal process at a temperature that deactivates the thermal-release adhesive. Upon debonding of the die attachment films 321, the first carrier substrate 350 may be detached from an assembly including the bridge dies 405, the EMC interposer frames 460, the die-side redistribution structures 470, and the semiconductor dies (701, 702), for example, by cleaving.

Figure 11:
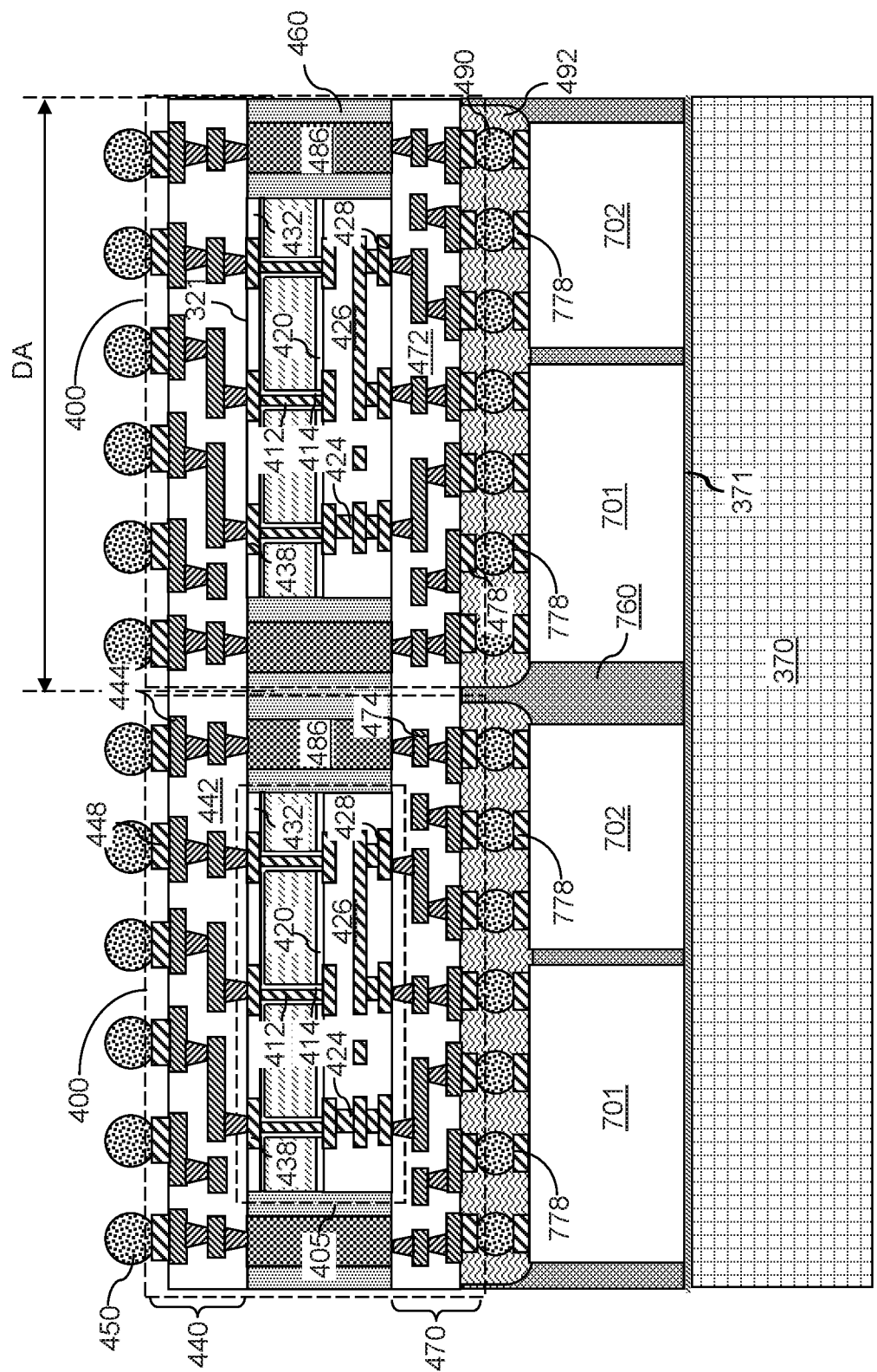
FIG. 11 is a vertical cross-sectional view of a region of the exemplary structure after formation of package-side redistribution structures and package-side C4 solder balls according to an embodiment of the present disclosure.

Referring to FIG. 11, the die attachment films 321 may be removed, for example, by cleaning a wet clean process. The physically exposed surfaces of the bridge dies 405 may be vertically recessed from the horizontal plane including the horizontal surfaces of the EMC interposer frames 460 and the TIV structures 486 by a vertical recess distance, which may be the same as the thickness of the die attachment films 321 prior to removal. For example, the vertical recess distance may be in a range from 50 microns to 200 microns.

Package-side redistribution structures 440 may be formed on the bridge dies 405, the EMC interposer frames 460, and the TIV structures 486. Specifically, a package-side redistribution structure 440 may be formed within each die area DA of the assembly including the bridge dies 405, the EMC interposer frames 460, and the TIV structures 486. The package-side redistribution structures 440 are redistribution structures that are formed on the substrate side, i.e., the side that faces a package substrate to be subsequently attached, with respect to the assembly of the bridge dies 405, the EMC interposer frames 460, and the TIV structures 486.

Each package-side redistribution structure 440 may include package-side redistribution dielectric layers 442, package-side redistribution wiring interconnects 444, and package-side bonding pads 448. The package-side redistribution dielectric layers 442 include a respective dielectric polymer material such as polyimide (PI), benzocyclobutene (BCB), or polybenzobisoxazole (PBO). Each package-side redistribution dielectric layer 442 may be formed by spin coating and drying of the respective dielectric polymer material. The thickness of each package-side redistribution dielectric layer 442 may be in a range from 2 microns to 40 microns, such as from 4 microns to 20 microns. Each package-side redistribution dielectric layer 442 may be patterned, for example, by applying and patterning a respective photoresist layer thereabove, and by transferring the pattern in the photoresist layer into the package-side redistribution dielectric layer 442 using an etch process such as an anisotropic etch process. The photoresist layer may be subsequently removed, for example, by ashing.

Each of the package-side redistribution wiring interconnects 444 and the package-side bonding pads 448 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 300 nm, and the copper seed layer may have a thickness in a range from 100 nm to 500 nm. The metallic fill material for the package-side redistribution wiring interconnects 444 may include copper, nickel, or copper and nickel. The thickness of the metallic fill material that is deposited for each package-side redistribution wiring interconnect 444 may be in a range from 2 microns to 40 microns, such as from 4 microns to 10 microns, although lesser or greater thicknesses may also be used. The total number of levels of wiring in each package-side redistribution structure 440 (i.e., the levels of the package-side redistribution wiring interconnects 444) may be in a range from 1 to 10.

The metallic fill material for the package-side bonding pads 448 may include copper. The thickness of the metallic fill material that is deposited for the package-side bonding pads 448 may be in a range from 5 microns to 100 microns, although lesser or greater thicknesses may also be used. The package-side bonding pads 448 may have horizontal cross-sectional shapes of rectangles, rounded rectangles, or circles. If the package-side bonding pads 448 are formed as C4 (controlled collapse chip connection) pads, the thickness of the package-side bonding pads 448 may be in a range from 5 microns to 50 microns, although lesser or greater thicknesses may also be used.

Generally, a package-side redistribution structure 440 may be formed each combination of a bridge die 405 and an encapsulant interposer frame, such as an EMC interposer frame 460 (which is a portion of a continuous EMC matrix that is located within a respective die area DA). The package-side redistribution structure may be formed directly on the package-side metal pads 438 of a respective bridge die 405 and directly on a respective EMC interposer frame 460. Each combination of a bridge die 405, an EMC interposer frame 460, a set of TIV structures 486, a die-side redistribution structure 470, and a package-side redistribution structure 440 within a die area DA constitutes a fan-out silicon interposer 400.

Within each die area DA, the horizontal plane including interfaces between the package-side metal pads 438 and the TSV structures 414 is more proximal to the at least one semiconductor die (701, 702) than the horizontal plane including the interface between the EMC interposer frame 460 and the package-side redistribution structure 440 is to the at least one semiconductor die (701, 702) by the sum of the thickness of the die attach film 321 and the thickness of the package-side metal pads 438. The horizontal plane including interfaces between the package-side metal pads 438 and the package-side redistribution structure 440 is more proximal to the at least one semiconductor die (701, 702) than the horizontal plane including the interface between the EMC interposer frame 460 and the package-side redistribution structure 440 is to the at least one semiconductor die (701, 702) by the thickness of the die-attach film 321 (which is removed at the processing steps of FIG. 8).

Each fan-out silicon interposer 400 comprises through-integrated-fan-out via (TIV) structures 486 that vertically extends through the EMC interposer frame 460 and electrically connecting a respective package-side redistribution wire interconnect 444 in the package-side redistribution structure 440 to a respective die-side redistribution wire interconnect 474 in the die-side redistribution structure 470. In one embodiment, the horizontal plane including interfaces between the package-side metal pads 438 and the TSV structures 414 is more proximal to the at least one semiconductor die (701, 702) than a horizontal plane including interfaces between the TIV structures 486 and the package-side redistribution structure 440 is to the at least one semiconductor die (701, 702) by the sum of the thickness of the die attach film 321 and the thickness of the package-side metal pads 438. The horizontal plane including interfaces between the package-side metal pads 438 and the package-side redistribution structure 440 is more proximal to the at least one semiconductor die (701, 702) than the horizontal plane including the interfaces between the TIV structures 486 and the package-side redistribution structure 440 is to the at least one semiconductor die (701, 702) by the thickness of the die-attach film 321 (which is removed at the processing steps of FIG. 8). Thus, interfaces between the TIV structures 486 and the package-side redistribution structure 440 are vertically offset from interfaces between the package-side metal pads 438 and the package-side redistribution structure 440 by the thickness of the die attach film 321.

Within each die area DA, the fan-out silicon interposer 400 comprises die-side metal pads 428 contacting the TSV structures 414 and located between the TSV structures 414 and the at least one semiconductor die (701, 702). The die-side metal pads 428 may contact the die-side redistribution wiring interconnects 474. Interfaces between the TIV structures 486 and the die-side redistribution structure 470 are located within the same horizontal plane as interfaces between the die-side metal pads 428 and the die-side redistribution structure 470.

Solder material portions 450 may be attached to the package-side bonding pads 448. In embodiments in which the package-side bonding pads 448 include C4 bonding pads, the solder material portions 450 may be C4 solder balls, i.e., solder material portions in the shapes of balls that may be used for C4 bonding. In embodiments in which the package-side bonding pads 448 include an array of microbumps for C2 bonding, the solder material portions 450 may be solder caps that wet the entirety of a planar end surface of a respective microbump and have generally hemispherical shapes.

Figure 12:
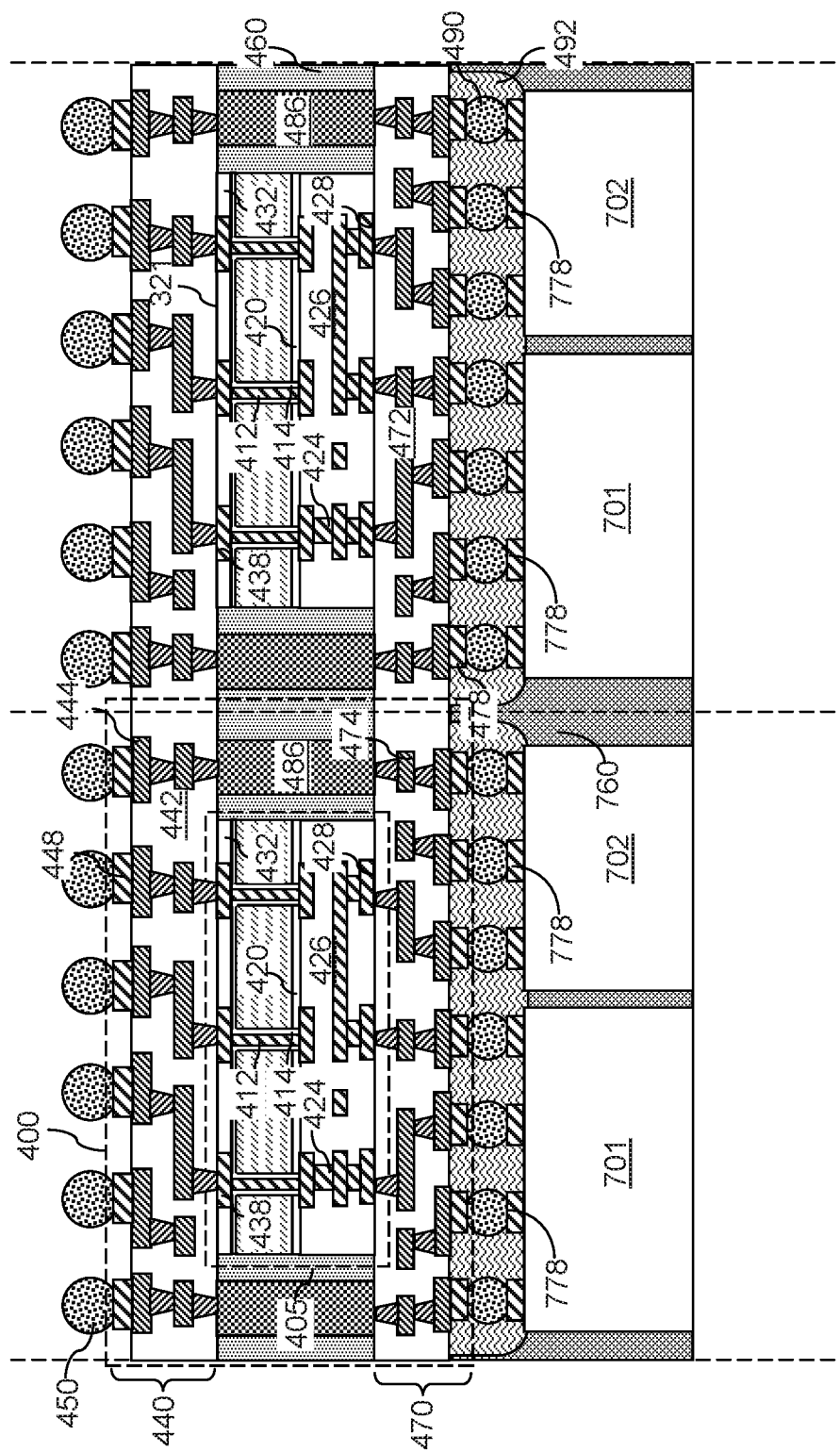
FIG. 12 is a vertical cross-sectional view of a region of the exemplary structure during singulation into after fan-out silicon interposers according to an embodiment of the present disclosure.

Referring to FIG. 12, the assembly of a two-dimensional array of fan-out silicon interposers 400, a two-dimensional array of semiconductor dies (701, 702), and a two-dimensional array of EMC die frames 760 may be detached from the second carrier substrate 370. The temporary adhesive layer (not shown) located between the second carrier substrate 370 and the two-dimensional array of EMC die frames 760 may be debonded by a suitable method, which may use irradiation of ultraviolet radiation onto the temporary adhesive layer or a thermal anneal. Subsequently, the assembly of a two-dimensional array of fan-out silicon interposers 400, a two-dimensional array of semiconductor dies (701, 702), and a two-dimensional array of EMC die frames 760 may be diced along dicing channels.

Figure 13:
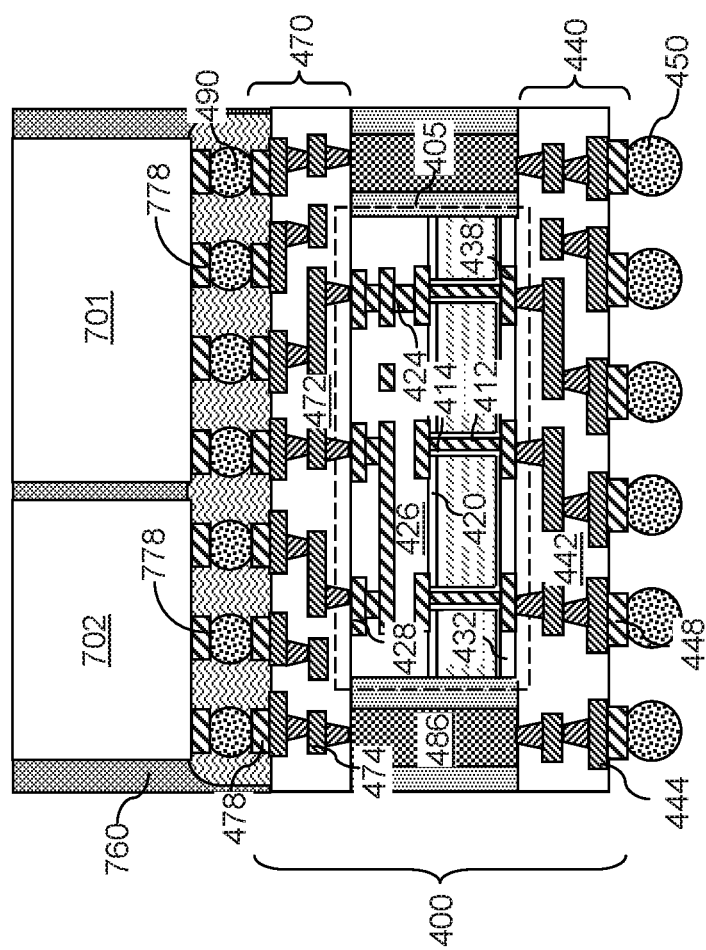
FIG. 13 is a vertical cross-sectional view of an assembly of a fan-out silicon interposer and semiconductor dies according to an embodiment of the present disclosure.

Referring to FIG. 13, a diced unit formed by singulation of the structure of FIG. 12 is illustrated. The diced unit includes a fan-out silicon interposer 400, at least one semiconductor die (701, 702) that is attached to the fan-out silicon interposer 400 through an array of solder material portions 490, and an EMC die frame 760. Generally, a fan-out silicon interposer 400 may include a bridge die 405 including an array of through-silicon via (TSV) structures 414; an epoxy molding compound (EMC) interposer frame 460 that laterally surrounds the bridge die 405; a die-side redistribution structure 470 including die-side bonding pads 478 to which at least one semiconductor die (701, 702) is attached; package-side metal pads 438 contacting package-side end surfaces of the array of TSV structures 414; and a package-side redistribution structure 440 located on the package-side metal pads 438 at an opposite side of the die-side redistribution structure 470 relative to the bridge die 405.

Each sidewall of the fan-out silicon interposer 400 and the EMC die frame 760 may be formed by dicing, e.g., by cutting through the materials of the EMC interposer frame 460 and the EMC die frame 760. As such, the sidewalls of the EMC die frame 760 may be vertically coincident with sidewalls of the EMC interposer frame 460. In other words, each sidewall of the EMC die frame 760 may be located entirely within a two-dimensional Euclidean vertical plane that includes a sidewall of the EMC interposer frame 460, and each sidewall of the EMC interposer frame 460 may be located entirely within a two-dimensional Euclidean vertical plane that includes a sidewall of the EMC die frame 760.

Figure 14:
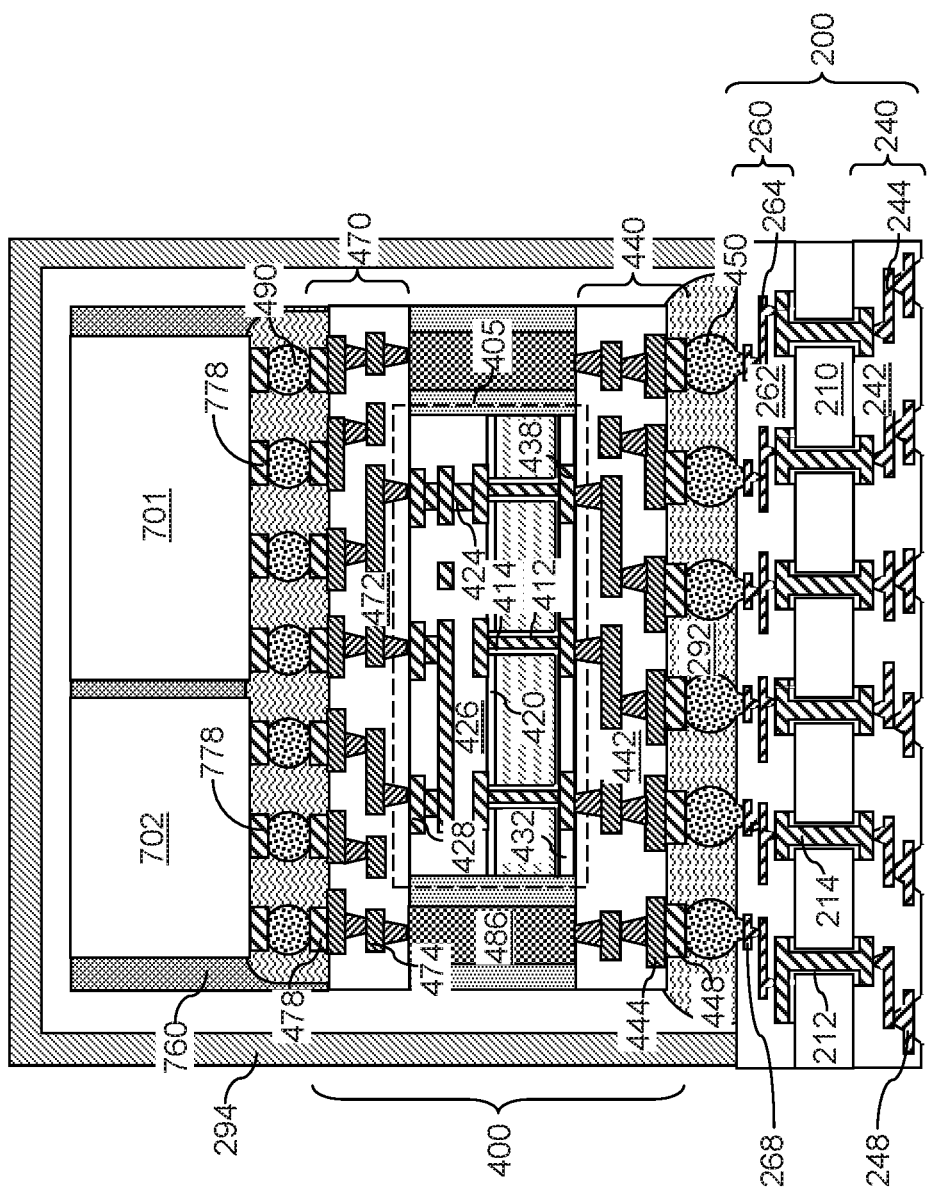
FIG. 14 is a vertical cross-sectional view of an assembly of a fan-out silicon interposer, semiconductor dies, a packaging substrate, and a ring structure according to an embodiment of the present disclosure.

Referring to FIG. 14, a package substrate 200 may be provided. The package substrate 200 may be a cored package substrate including a core substrate 210, or a coreless package substrate that does not include a package core. The core substrate 210 may include a glass epoxy plate including an array of through-plate holes. An array of through-core via structures 214 including a metallic material may be provided in the through-plate holes. Each through-core via structure 214 may, or may not, include a cylindrical hollow therein. Optionally, dielectric liners 212 may be used to electrically isolate the through-core via structures 214 from the core substrate 210.

The package substrate 200 may include board-side surface laminar circuit (SLC) 240 and a chip-side surface laminar circuit (SLC) 260. The board-side SLC 240 may include board-side insulating layers 242 with board-side wiring interconnects 244 formed therein. The chip-side SLC 260 may include chip-side insulating layers 262 with chip-side wiring interconnects 264 formed therein. The board-side insulating layers 242 and the chip-side insulating layers 262 may include a photosensitive epoxy material that may be lithographically patterned and subsequently cured. The board-side wiring interconnects 244 and the chip-side wiring interconnects 264 may include copper that may be deposited by electroplating within patterns in the board-side insulating layers 242 or the chip-side insulating layers 262. An array of board-side bonding pads 248 may be electrically connected to the board-side wiring interconnects 244, and may be configured to allow bonding through solder balls. An array of chip-side bonding pads 268 may be electrically connected to the chip-side wiring interconnects 264, and may be configured to allow bonding through C4 solder balls.

The solder material portions 450 attached to the package-side bonding pads 448 of an assembly of a fan-out silicon interposer 400, at least one semiconductor die (701, 702), and an EMC die frame 760 may be disposed on the array of the chip-side bonding pads 268 of the package substrate 200. A reflow process may be performed to reflow the solder material portions 450, thereby inducing bonding between the fan-out silicon interposer 400 and the package substrate 200. In one embodiment, the solder material portions 450 may include C4 solder balls, and the assembly of the fan-out silicon interposer 400, the at least one semiconductor die (701, 702), and the EMC die frame 760 may be attached to the package substrate 200 using an array of C4 solder balls. An underfill material portion 292 may be formed around the solder material portions 450 by applying and shaping an underfill material. Optionally, a stabilization structure 294, such as a cap structure or a ring structure, may be attached to the assembly of the fan-out silicon interposer 400, the at least one semiconductor die (701, 702), the EMC die frame 760, and the package substrate 200 to reduce deformation of the assembly during subsequent processing steps and/or during usage of the assembly.

Figure 15:
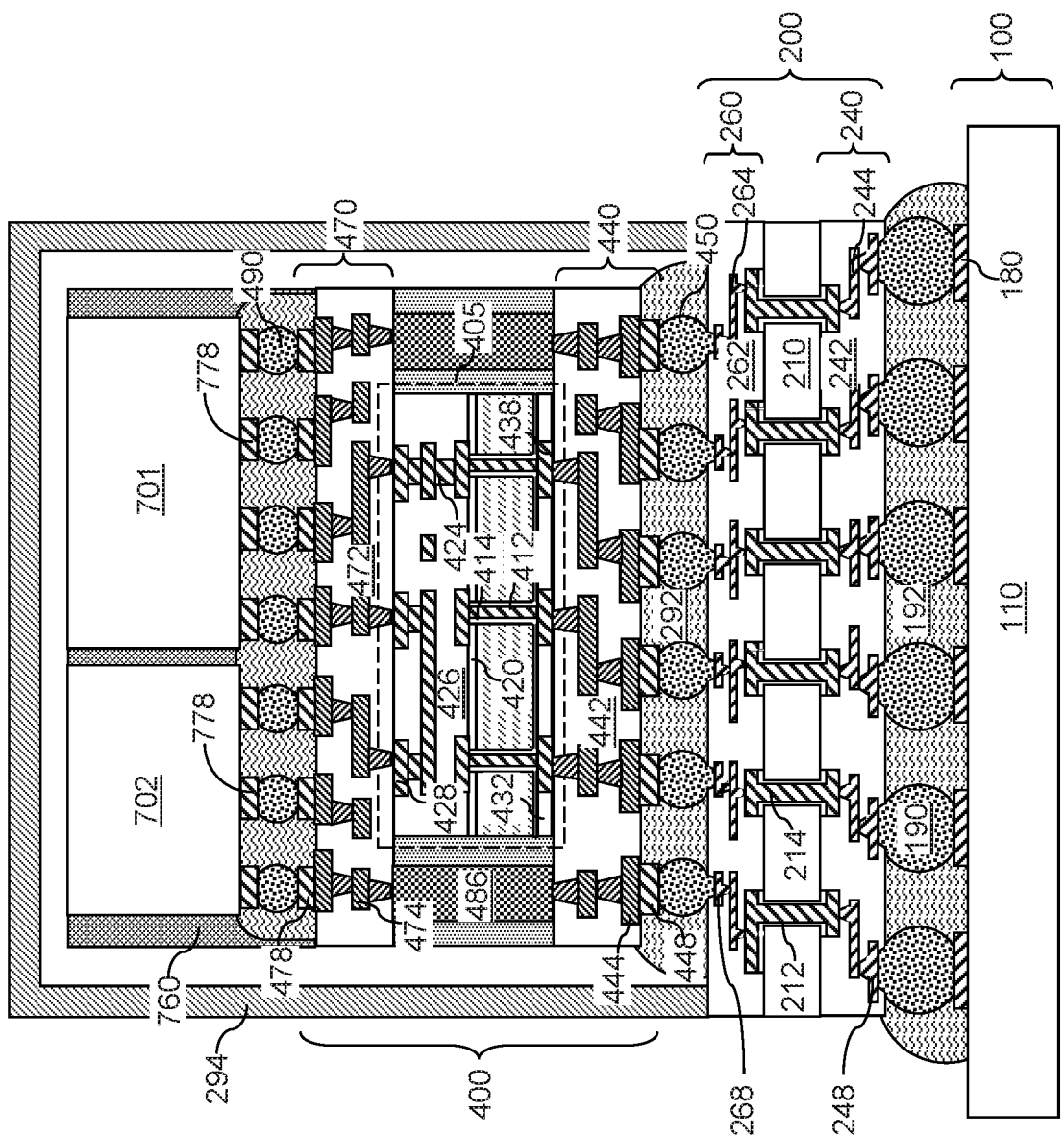
FIG. 15 is a vertical cross-sectional view of a structure formed by attaching the assembly of a fan-out silicon interposer, a packaging substrate, and a ring structure to a printed circuit board (PCB) according to an embodiment of the present disclosure.

Referring to FIG. 15, a printed circuit board (PCB) 100 including a PCB substrate 110 and PCB bonding pads 180 may be provided. The PCB 100 includes a printed circuitry (not shown) at least on one side of the PCB substrate 110. An array of solder joints 190 may be formed to bond the array of board-side bonding pads 248 to the array of PCB bonding pads 180. The solder joints 190 may be formed by disposing an array of solder balls between the array of board-side bonding pads 248 and the array of PCB bonding pads 180, and by reflowing the array of solder balls. An underfill material portion 192 may be formed around the solder joints 190 by applying and shaping an underfill material. The package substrate 200 is attached to the PCB 100 through the array of solder joints 190.

Figure 16:
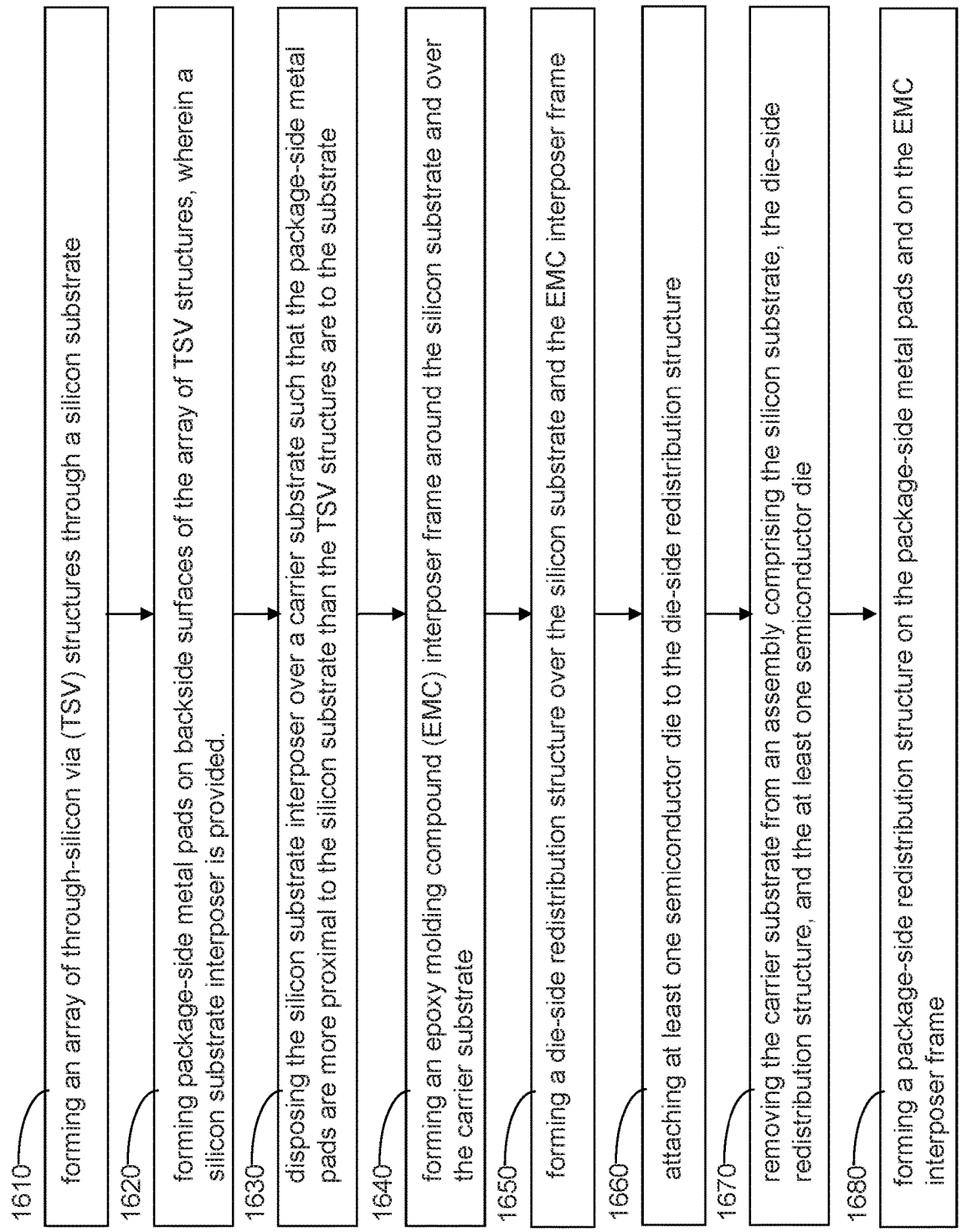
FIG. 16 is a first flowchart illustrating steps for forming a chip package structure according to an embodiment of the present disclosure.

Referring to FIG. 16, a set of general processing steps for forming a chip package structure is illustrated according to an embodiment of the present disclosure. Referring to step 1610, an array of through-silicon via (TSV) structures 414 may be formed through a silicon substrate 410. Referring to step 1620, package-side metal pads 438 are formed on backside surfaces of the array of TSV structures 414. A bridge die 405 is provided. Referring to step 1630, the bridge die 405 is disposed over a carrier substrate 350 such that the package-side metal pads 438 are more proximal to the carrier substrate 350 than the TSV structures 414 are to the carrier substrate 350. Referring to step 1640, an epoxy molding compound (EMC) interposer frame 460 is formed around the bridge die 405 and over the carrier substrate 350. Referring to step 1650, a die-side redistribution structure 470 is formed over the bridge die 405 and the EMC interposer frame 460. Referring to step 1660, at least one semiconductor die (701, 702) is attached to the die-side redistribution structure 470. Referring to step 1670, the carrier substrate 350 is removed from an assembly comprising the bridge die 405, the die-side redistribution structure 470, and the at least one semiconductor die (701, 702). Referring to step 1680, a package-side redistribution structure 440 is formed on the package-side metal pads 438 and on the EMC interposer frame 460.

Referring to FIG. 17, another set of general processing steps for forming a chip package structure is illustrated according to an embodiment of the present disclosure. Referring to step 1601, via structures 414 are formed through an upper portion of a silicon substrate 410. Referring to step 1602, die-side metal interconnect structures 424 are formed over the via structures 414. Referring to step 1610, an array of through-silicon via (TSV) structures 414 may be formed through a silicon substrate 410. Referring to step 1620, package-side metal pads 438 are formed on backside surfaces of the array of TSV structures 414. A bridge die 405 is provided. Referring to step 1630, the bridge die 405 is disposed over a carrier substrate 350 such that the package-side metal pads 438 are more proximal to the carrier substrate 350 than the TSV structures 414 are to the carrier substrate 350. Referring to step 1640, an epoxy molding compound (EMC) interposer frame 460 is formed around the bridge die 405 and over the carrier substrate 350. Referring to step 1650, a die-side redistribution structure 470 is formed over the bridge die 405 and the EMC interposer frame 460. Referring to step 1660, at least one semiconductor die (701, 702) is attached to the die-side redistribution structure 470. Subsequently, steps 1670 and 1680 in FIG. 16 may be optionally performed as needed.

Referring to all drawings and according to various embodiments of the present disclosure, a fan-out silicon interposer 400 is provided. The fan-out silicon interposer 400 comprises: a bridge die 405 including an array of through-silicon via (TSV) structures 414 extending through a silicon substrate 410; an encapsulant interposer frame such as an epoxy molding compound (EMC) interposer frame 460 that laterally surrounds the bridge die 405; a die-side redistribution structure 470 including die-side bonding pads 478 to which the at least one semiconductor die (701, 702) is attached; package-side metal pads 438 contacting package-side end surfaces of the array of TSV structures 414; and a package-side redistribution structure 440 located on the package-side metal pads 438 at an opposite side of the die-side redistribution structure 470 relative to the bridge die 405.

According to an embodiment of the present disclosure: a fan-out silicon interposer 400 is provided. The fan-out silicon interposer 400 comprises: a bridge die 405 including an array of through-silicon via (TSV) structures 414; package-side metal pads 438 contacting end surfaces of the array of TSV structures 414; an encapsulant, such as an EMC interposer frame 460 that laterally surrounds the bridge die 405; through-integrated-fan-out via (TIV) structures 486 that vertically extends through the EMC interposer frame 460; a package-side redistribution structure 440 located on the package-side metal pads 438; and a die-side redistribution structure 470 located between the bridge die 405 and the at least one semiconductor die (701, 702) and including die-side bonding pads 478 to which the at least one semiconductor die (701, 702) is attached.

The various structures and methods of the present disclosure may be used to provide a fan-out silicon interposer 400, which may have formed therein a bridge die 405 that contains an array of TSV structures 414 and an array of TIV structures 486. Variations in alignment between the array of TSV structures 414 and the array of TIV structures 486 are inherent because the bridge die 405 is placed among the array of TIV structures 486 by a pick and place operation. The impact of the alignment variations between the array of TSV structures 414 and the array of TIV structures 486 at the time of formation of the package-side redistribution structure 440 may be minimized through use of the package-side metal pads 438. The package-side metal pads 438 contact end surfaces of the array of TSV structures 414 and has a greater area than the end surfaces of the array of TSV structures 414. Thus, the package-side metal pads 438 provide a greater contact area than the end surface of a respective underlying TSV structure 414 during formation of the package-side redistribution wiring interconnects 444. The impact of overlay variations between the bridge die 405 and the TIV structures 486 is reduced through use of the package-side metal pads 438. The fan-out silicon interposer 400 may be manufactured with a higher process yield, and may provide enhanced reliability during lifetime.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fan-out silicon interposer comprising:
a bridge die including an array of through-silicon via (TSV) structures extending through a silicon substrate, package-side metal pads contacting package-side end surfaces of the array of TSV structures, and a package-side dielectric material layer that laterally surrounds the package-side metal pads;
an encapsulant interposer frame that laterally surrounds the bridge die;
a die-side redistribution structure including die-side bonding pads; and
a package-side redistribution structure located on the package-side metal pads at an opposite side of the die-side redistribution structure relative to the bridge die and contacting the package-side dielectric material layer of the bridge die.

2. The fan-out silicon interposer of claim 1, wherein each of the package-side metal pads contacts an end surface of a respective one of the TSV structures and has a greater horizontal cross-sectional area than the end surface of the respective one of the TSV structures.

3. The fan-out silicon interposer of claim 1, wherein the encapsulant interposer frame is an epoxy molding compound (EMC) interposer frame, and wherein a horizontal plane including interfaces between the package-side metal pads and the TSV structures is more proximal to the die-side bonding pads than a horizontal plane including an interface between the EMC interposer frame and the package-side redistribution structure is to the die-side bonding pads.

4. The fan-out silicon interposer of claim 3, wherein a horizontal plane including interfaces between the package-side metal pads and the package-side redistribution structure is more proximal to the die-side bonding pads than the horizontal plane including the interface between the EMC interposer frame and the package-side redistribution structure is to the die-side bonding pads.

5. The fan-out silicon interposer of claim 1, wherein the encapsulant interposer frame is an epoxy molding compound (EMC) interposer frame, and wherein the fan-out silicon interposer comprises through-integrated-fan-out via (TIV) structures that vertically extends through the EMC interposer frame and electrically connecting a respective package-side redistribution wire interconnect in the package-side redistribution structure to a respective die-side redistribution wire interconnect in the die-side redistribution structure.

6. The fan-out silicon interposer of claim 5, wherein a horizontal plane including interfaces between the package-side metal pads and the TSV structures is more proximal to the die-side bonding pads than a horizontal plane including interfaces between the TIV structures and the package-side redistribution structure is to the die-side bonding pads.

7. The fan-out silicon interposer of claim 6, wherein a horizontal plane including interfaces between the package-side metal pads and the package-side redistribution structure is more proximal to the die-side bonding pads than the horizontal plane including the interfaces between the TIV structures and the package-side redistribution structure is to the die-side bonding pads.

8. The fan-out silicon interposer of claim 5, further comprising:
die-side metal pads contacting the TSV structures and located between the TSV structures and the die-side bonding pads; and
interfaces between the TIV structures and the die-side redistribution structure are located within a same horizontal plane as interfaces between the die-side metal pads and the die-side redistribution structure.

9. The fan-out silicon interposer of claim 1, wherein:
each of the TSV structures is laterally surrounded by a respective cylindrical portion of a through-substrate insulating spacer; and
the silicon substrate is vertically spaced from a horizontal plane including interfaces between the package-side metal pads and the TSV structures by a backside insulating layer that laterally surrounds the cylindrical portions of the through-substrate insulating spacer.

10. The fan-out silicon interposer of claim 1, wherein:
the die-side bonding pads comprises an array of microbumps; and
package-side bonding pads comprising an array of C4 bonding pads, wherein the package-side bonding pads are located on the package-side redistribution structure and are electrically connected to a respective one of the package-side metal pads.

11. The fan-out silicon interposer of claim 1, wherein the bridge die comprises die-side metal interconnect structures electrically connecting a respective one of the TSV structures and a respective one of the die-side redistribution structures.

12. The fan-out silicon interposer of claim 11, wherein the die-side metal interconnect structures comprises a combination of metal line structures and metal via structures, or integrated metal line and via structures.

13. A fan-out silicon interposer comprising:
a bridge die including an array of through-silicon via (TSV) structures, package-side metal pads contacting package-side end surfaces of the array of TSV structures, and a package-side dielectric material layer that laterally surrounds the package-side metal pads;
an encapsulant interposer frame that laterally surrounds the bridge die;
through-integrated-fan-out via (TIV) structures that vertically extends through the EMC interposer frame;
a package-side redistribution structure located on the package-side metal pads and contacting the package-side dielectric material layer of the bridge die; and
a die-side redistribution structure electrically connected to the array of TSV structures and including die-side bonding pads.

14. The fan-out silicon interposer of claim 13, wherein interfaces between the TIV structures and the package-side redistribution structure are vertically offset from interfaces between the package-side metal pads and the package-side redistribution structure.

15. A method of forming a chip package structure, comprising:
forming via structures through an upper portion of a silicon substrate;
forming die-side metal interconnect structures over the via structures;
forming an array of through-silicon via (TSV) structures by thinning a backside the silicon substrate, wherein the via structures vertically extend through an entire thickness of the thinned silicon substrate to become the array of TSV structures;
forming package-side metal pads laterally surrounded by a package-side dielectric layer on backside surfaces of the array of TSV structures, whereby a bridge die is formed;
disposing the bridge die over a carrier substrate;
forming an encapsulant interposer frame around the bridge die and over the carrier substrate;

forming a die-side redistribution structure over the bridge die and the encapsulant interposer frame;

attaching at least one semiconductor die to the die-side redistribution structure; and forming a package-side redistribution structure comprising package-side redistribution dielectric layers over the package-side metal pads directly on the package-side dielectric material layer.

16. The method of claim 15, wherein each of the package-side metal pads is formed directly on an end surface of a respective one of the TSV structures and has a greater horizontal cross-sectional area than the end surface of the respective one of the TSV structures.

17. The method of claim 15, further comprising removing the carrier substrate from an assembly comprising the bridge die, the die-side redistribution structure, and the at least one semiconductor die.

18. The method of claim 17, wherein:
the die-side metal interconnect structures comprise die-side metal pads at a topmost level;
the bridge die is attached to the carrier substrate by providing a die attach film between the carrier substrate and the bridge die; and
removing the die attach film after attaching the at least one semiconductor die to the die-side redistribution structure.

19. The method of claim 18, wherein:
the encapsulant interposer frame is an epoxy molding compound (EMC) interposer frame;
the package-side redistribution structure is formed directly on the EMC interposer frame and the package-side metal pads; and
a horizontal plane including interfaces between the package-side metal pads and the package-side redistribution structure is recessed toward the at least one semiconductor die relative to a horizontal plane including the interface between the EMC interposer frame and the package-side redistribution structure by a thickness of the die-attach film.

20. The method of claim 17, further comprising attaching a structure including the assembly and the package-side redistribution structure to a package substrate using an array of C4 solder balls.

* * * * *